(12) United States Patent
Fukumura

(10) Patent No.: US 9,391,178 B2
(45) Date of Patent: Jul. 12, 2016

(54) METHOD OF MANUFACTURING SEMICONDUCTOR DEVICE

(71) Applicant: RENESAS ELECTRONICS CORPORATION, Kawasaki-shi (JP)

(72) Inventor: Tatsuya Fukumura, Kanagawa (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 552 days.

(21) Appl. No.: 13/848,440

(22) Filed: Mar. 21, 2013

(65) Prior Publication Data

US 2013/0253690 A1 Sep. 26, 2013

(30) Foreign Application Priority Data

Mar. 21, 2012 (JP) ................................ 2012-063630

(51) Int. Cl.
| | |
|---|---|
| H01L 29/66 | (2006.01) |
| H01L 21/28 | (2006.01) |
| H01L 29/792 | (2006.01) |
| H01L 27/115 | (2006.01) |

(Continued)

(52) U.S. Cl.
CPC ...... *H01L 29/66833* (2013.01); *G11C 16/0475* (2013.01); *H01L 21/28282* (2013.01); *H01L 27/11573* (2013.01); *H01L 29/4234* (2013.01); *H01L 29/792* (2013.01)

(58) Field of Classification Search
CPC ............. H01L 2924/1438; H01L 2924/14511; H01L 27/11563; H01L 27/11568; H01L 27/11578; H01L 27/1157; H01L 27/11573; H01L 27/11575
See application file for complete search history.

(56) References Cited

U.S. PATENT DOCUMENTS

| | | | |
|---|---|---|---|
| 7,259,422 B1 | 8/2007 | Hisamoto et al. | |
| 8,058,162 B2 | 11/2011 | Onda | |

(Continued)

FOREIGN PATENT DOCUMENTS

| | | |
|---|---|---|
| JP | 2007-243095 A | 9/2007 |
| JP | 2010-67645 A | 3/2010 |

(Continued)

OTHER PUBLICATIONS

Japanese Notification of Reasonse for Refusal issued in corresponding Japanese Patent Application No. 2012-063630 mailed on Mar. 3, 2015; 10 pages with English translation.
Office Action issued in corresponding Taiwanese Patent Application No. 102108535, mailed on Apr. 6, 2016; with English translation.

*Primary Examiner* — Yu-Hsi D Sun
(74) *Attorney, Agent, or Firm* — McDermott Will & Emery LLP

(57) ABSTRACT

Provided is a method of manufacturing a semiconductor device which allows an operation of the semiconductor device to be stabilized without increasing the area occupied thereby. The control gate electrode of a memory cell transistor is formed, and then the memory gate electrode thereof is formed on a lateral side of the control gate electrode. Then, memory offset spacers are formed over the side walls of the memory gate electrode. Then, the memory source region of the memory cell transistor is formed by ion implantation using the memory gate electrode, the memory offset spacers, and the like as a mask. Then, the memory drain region of the memory cell transistor is formed by ion implantation. Then, in the memory cell transistor, sidewall insulating films are formed. The memory offset spacers disappear through cleaning or the like before the sidewall insulating films are formed.

3 Claims, 40 Drawing Sheets

(51) Int. Cl.
*H01L 29/423* (2006.01)
*G11C 16/04* (2006.01)

(56) References Cited

U.S. PATENT DOCUMENTS

| | | | |
|---|---|---|---|
| 8,133,795 | B2 | 3/2012 | Funayama et al. |
| 8,450,790 | B2 | 5/2013 | Kawashima |
| 8,461,642 | B2 | 6/2013 | Homma et al. |
| 2007/0210371 | A1 | 9/2007 | Hisamoto et al. |
| 2010/0059810 | A1* | 3/2010 | Homma ............... H01L 27/11 257/324 |
| 2011/0001179 | A1 | 1/2011 | Yanagi et al. |

FOREIGN PATENT DOCUMENTS

| | | |
|---|---|---|
| JP | 2010-025345 A | 10/2010 |
| JP | 2010-282987 A | 12/2010 |
| JP | 2011-29631 A | 2/2011 |
| JP | 2011-049580 A | 3/2011 |
| JP | 2011-103401 A | 5/2011 |
| JP | 2011-119331 A | 6/2011 |
| JP | 05-114608 A1 | 1/2013 |
| TW | 200816391 A | 4/2008 |

* cited by examiner

FIG. 30

| | SOURCE (SR) | MEMORY GATE ELECTRODE (MG) | CONTROL GATE ELECTRODE (CG) | DRAIN (DR) |
|---|---|---|---|---|
| WRITE | 5V | 10V | 1.0V | 0.4V |
| ERASE | 6V | −6V | 0V | OPEN |
| READ | 0V | 1.5V | 1.5V | 1.5V |

METHOD OF MANUFACTURING SEMICONDUCTOR DEVICE

CROSS-REFERENCE TO RELATED APPLICATIONS

The disclosure of Japanese Patent Application No. 2012-063630 filed on Mar. 21, 2012 including the specification, drawings and abstract is incorporated herein by reference in its entirety.

BACKGROUND

The present invention relates to a method of manufacturing a semiconductor device, and particularly to a method of manufacturing a semiconductor device applied to a semiconductor device including a flash memory having a split-gate MONOS structure.

As a nonvolatile semiconductor memory, flash memories are widely used. A type of such flash memories is a flash memory using a split-gate MONOS (Metal-Oxide-Nitride-Oxide-Silicon) structure. In each of memory cell transistors in this type of flash memory, a memory gate electrode for operating the memory cell and a control gate electrode for selecting the memory cell are separately provided. The memory gate electrode is formed in a sidewall shape over a side wall of the control gate electrode with an insulating film for holding charges being interposed therebetween.

Next, a description will be given of an example of an operation of the flash memory having the split-gate MONOS structure. A write operation is performed by a so-called SSI (Source Side Injection) method. That is, the write operation is performed by injecting hot electrons generated through the acceleration of electrons flowing from a drain region to a source region into an insulating film holding charges which is located immediately below a memory gate electrode. By the injection of the hot electrons into the insulating film holding charges, the threshold voltage of the memory gate electrode is increased.

On the other hand, an erase operation is performed using a band-to-band tunneling phenomenon (BTBT erasing). That is, the erase operation is performed by injecting holes generated in the vicinity of an end portion of a memory source region located immediately below the memory gate electrode into the insulating film holding charges. The threshold voltage of the memory gate electrode that has been increased by the injection of the hot electrons is reduced by the injection of the holes.

In a read operation, as the threshold voltage, a middle voltage between the threshold voltage of the memory gate electrode in a write state and the threshold voltage of the memory gate electrode in an erase state is applied to the memory gate electrode to thus determine whether the memory gate electrode is in the write state or the erase state. Documents each disclosing this type of flash memory include Patent Documents 1 and 2.

RELATED ART DOCUMENTS

Patent Documents

[Patent Document 1]
  Japanese Unexamined Patent Publication No. 2011-119331
[Patent Document 2]
  Japanese Unexamined Patent Publication No. 2011-49580

SUMMARY

In the flash memory having the split-gate MONOS structure, the memory gate length of the memory gate electrode affects an erase characteristic. The memory gate length refers to the length in a gate length direction of the portion of the memory gate electrode overlapping the region of the semiconductor substrate serving as a channel.

When the memory gate length is short, the holes injected into the insulating film holding charges in the erase operation are likely to be diffused. As a result, the threshold voltage of the memory gate electrode that has been reduced by the injection of the holes increases accordingly due to the holes that have been diffused and dissipated, resulting in an unstable operation of the flash memory.

To prevent this, an attempt has been made to further increase the thickness of the memory gate electrode and ensure a sufficient memory gate length for the memory cell transistor, resulting in the problem of an increased area occupied by the region where the flash memory is disposed.

Other problems and novel features of the present invention will become apparent from a statement in the present specification and the accompanying drawings.

A method of manufacturing a semiconductor device according to an embodiment includes the steps of implanting, using offset spacers as a mask, a predetermined impurity into a first area of a first element formation region which is located on a side on which the second gate electrode of first and second gate electrodes is disposed to form an impurity region of a predetermined conductivity type, and removing the offset spacers.

A method of manufacturing a semiconductor device according to another embodiment includes the steps of implanting, obliquely to a main surface, a predetermined impurity into a first area of a first element formation region which is located on a side on which the second gate electrode of first and second gate electrodes is disposed, while gradually moving away from a side wall of the second gate electrode in a direction from an upper portion of the second gate electrode toward a lower portion thereof to form an impurity region of a predetermined conductivity type.

According to the method of manufacturing the semiconductor device according to the embodiment, it is possible to stabilize an operation of the semiconductor device without increasing the area occupied thereby.

According to the method of manufacturing the semiconductor device according to the other embodiment, it is possible to stabilize an operation of the semiconductor device without increasing the area occupied thereby.

BRIEF DESCRIPTION OF THE DRAWINGS

FIG. 30 is a view for illustrating an operation of a memory cell transistor in Embodiment 1;

DETAILED DESCRIPTION

Embodiment 1

First, a description will be given of the outline of a semiconductor device in each of embodiments. The semiconductor device includes a flash memory having a split-gate MONOS structure, and is applied to, e.g., a microcomputer.

Figure 1:
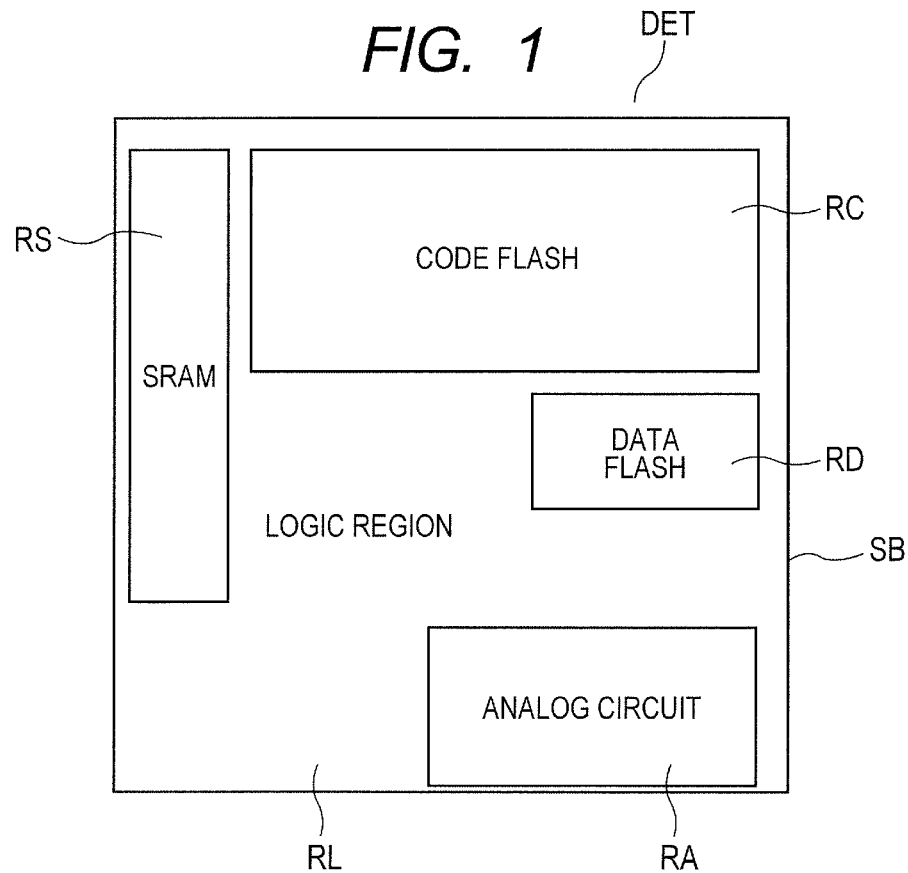
FIG. 1 is a plan view showing an example of a layout in a semiconductor device according to each of embodiments.

FIG. 1 shows an example of a two-dimensional layout in a semiconductor chip DET as the semiconductor device. As shown in FIG. 1, over the surface of the semiconductor chip DET (semiconductor substrate SB), a code flash region RC, a data flash region RD, an SRAM region RS, an analog circuit region RA, and a logic circuit region RL are mainly formed.

In the code flash region RC, a flash memory for storing programs is formed. In the data flash region RD, a flash memory for storing data is formed. In the SRAM region RS, a so-called SRAM (Static Random Access Memory) is formed. In the analog circuit region RA, a high-breakdown-voltage circuit for analog/digital conversion or the like is formed. In the logic circuit region RL, a CPU (Central Processing Unit) and the like are formed.

In the logic circuit region RL and the SRAM region RS, transistors each having a relatively thin gate oxide film as a gate oxide film are formed. The transistors are called core transistors. The core transistors are formed also in peripheral circuits in the code flash region RC and the data flash region RD and in the analog circuit region RA.

In the analog circuit region RA, transistors each having a relatively thick gate oxide film as the gate oxide film are formed. The transistors are called input/output (I/O) transistors. The input/output transistors are formed also in the logic circuit region RL.

Figure 2:
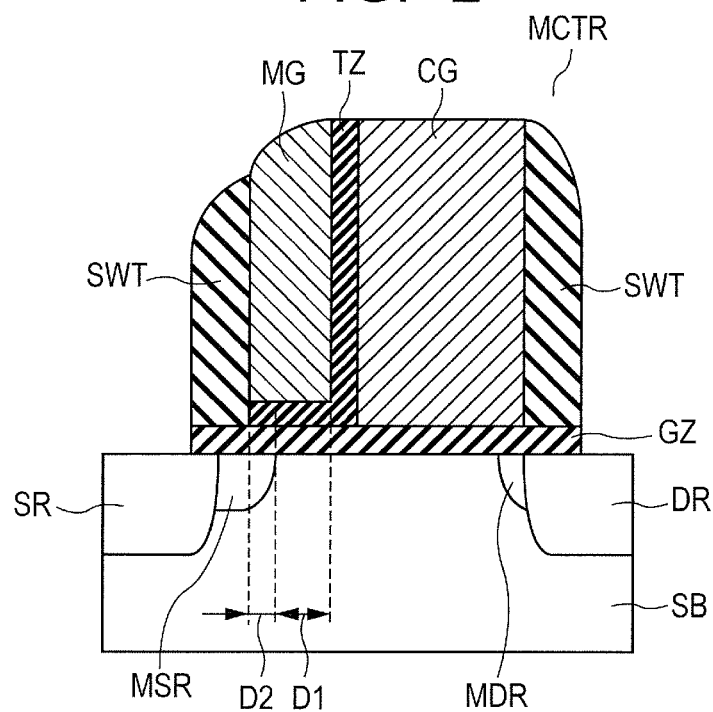
FIG. 2 is a cross-sectional view showing a structure of a memory cell transistor in a semiconductor device according to Embodiment 1.

Next, a description will be given of a structure of each of memory cell transistors in a flash memory. As shown in FIG. 2, a split-gate MONOS memory cell transistor MCTR includes a control gate electrode CG, a memory gate electrode MG, a memory source region MSR, a memory drain region MDR, a source region SR, and a drain region DR.

The memory source region MSR and the memory drain region MDR are each formed to a predetermined depth from the surface of the semiconductor substrate SB to be spaced apart from each other with a gap (first gap) interposed therebetween. The source region SR and the drain region DR are each formed to a predetermined depth from the surface of the semiconductor substrate SB to be spaced apart from each other with a gap wider than the first gap being interposed therebetween.

The control gate electrode CG and the memory gate electrode MG are formed over the surface of the semiconductor substrate SB being interposed between the source region SR and the drain region DR so as to oppose each other with a gate oxide film GZ being interposed therebetween. Between the control gate electrode CG and the memory gate electrode MG, an ONO film TZ for holding charges is formed. The ONO film TZ is a laminate film including an oxide film, a nitride film, and an oxide film.

Over the side wall of the control gate electrode CG opposite to the side wall thereof opposing the memory gate electrode MG, a sidewall TEOS film SWT is formed. Also, over the side wall of the memory gate electrode MG opposite to the side wall thereof opposing the control gate electrode CG, the sidewall TEOS film SWT is formed.

As will be described later, in the memory cell transistor MCTR, a length (overlap length) D2 in a gate length direction of a portion in which the memory gate electrode MG and the memory source region MSR oppose each other is shortened to ensure a sufficient memory gate length D1 and thereby allow the retention characteristic of the memory cell transistor to be stabilized.

Figure 3:
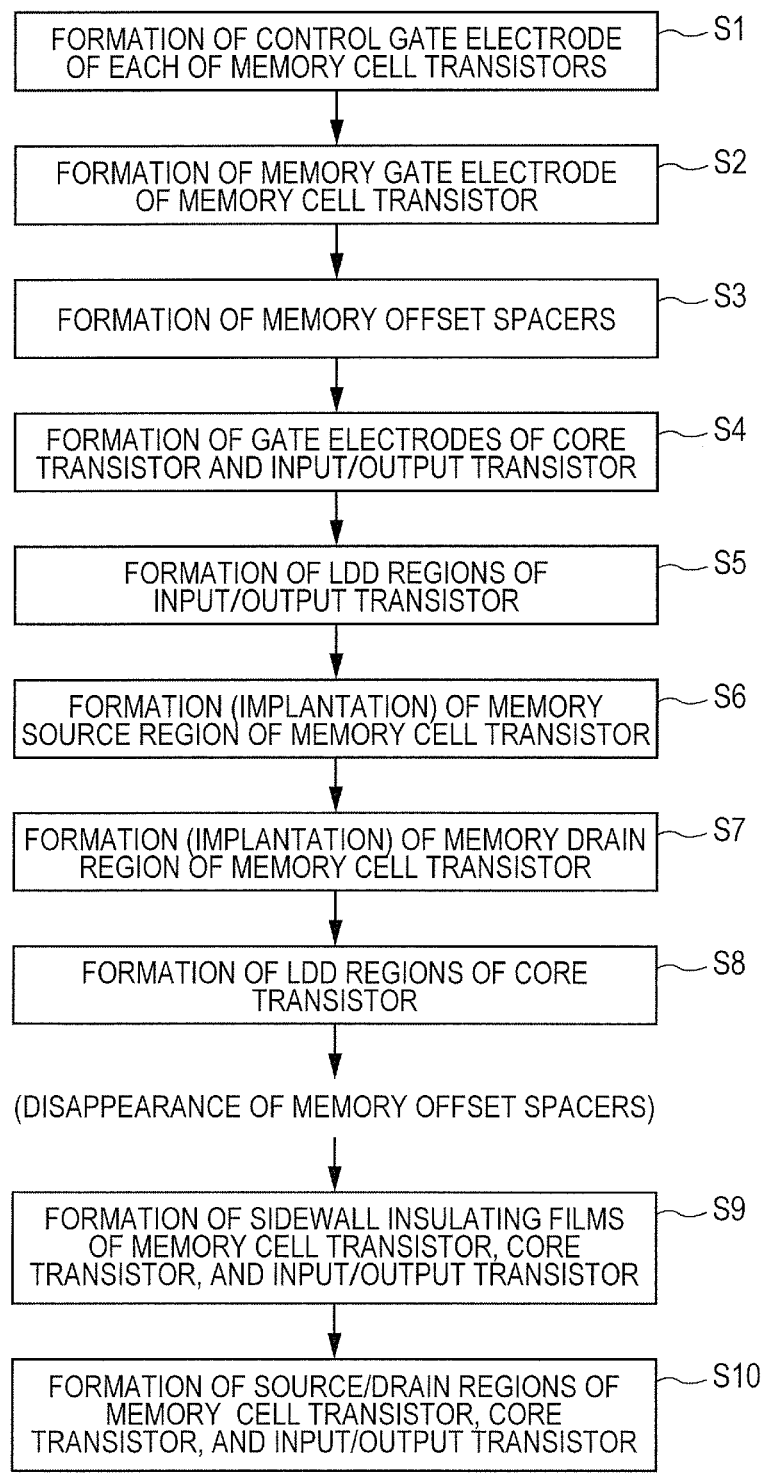
FIG. 3 is a view showing a manufacturing flow for the semiconductor device in Embodiment 1.

Next, a description will be given first of a manufacturing flow in a method of manufacturing the semiconductor device including the flash memory described above according to the flow chart shown in FIG. 3. First, in Step S1, the control gate electrode of each of the memory cell transistors is formed. Next, in Step S2, the memory gate electrode is formed on a lateral side of the control gate electrode. Next, in Step 3, memory offset spacers are formed over the side walls of the memory gate electrode.

Next, in Step S4, the respective gate electrodes of the core transistors and the input/output transistors are formed. In Step S5, the LDD (Lightly Doped Drain) regions of the input/output transistors are formed. Then, in Step S6, the memory source region of each of the memory cell transistors is formed by ion implantation using the memory gate electrode, the memory offset spacers, and the like as a mask. Then, in Step S7, the memory drain region of the memory cell transistor is formed by ion implantation.

Next, in Step S8, the LDD regions of the core transistors are formed. Then, in Step S9, in the memory cell transistors, the core transistors, and the input/output transistors, respective sidewall insulating films are formed. Note that the memory offset spacers disappear through cleaning or the like before the sidewall insulating films are formed. Then, in Step S10, the respective source regions and drain regions of the memory cell transistors, the core transistors, and the input/output transistors are formed. Thus, as the main portion of the semiconductor device, the memory cell transistors, the core transistors, and the input/output transistors are formed.

Figure 4:
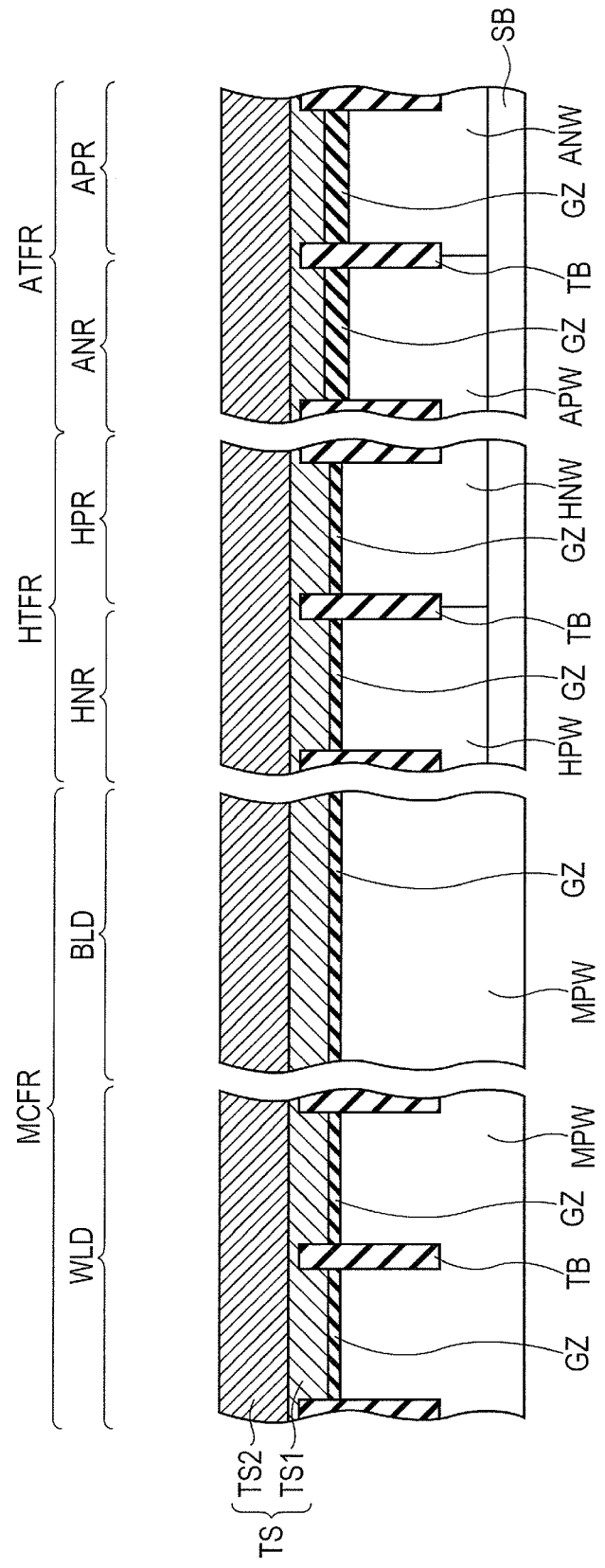
FIG. 4 is a cross-sectional view showing a step of a method of manufacturing the semiconductor device in Embodiment 1.

Next, a specific description will be given of an example of the method of manufacturing the semiconductor device in Embodiment 1. As shown in FIG. 4, to a predetermined depth from the main surface of the semiconductor substrate SB, isolation insulating films TB are formed to thereby define, as element formation regions, regions MCFR, HTFR, and ATGR where the memory cell transistors, the core transistors, and the input/output transistors are to be formed.

In each of the process step views including FIG. 4, in the region MCFR, a cross-sectional structure in a bit-line direction BLD and a cross-sectional structure in a word-line direction WLD are shown. In the region HTFR, a cross-sectional structure of a region HNR where the n-channel core transistor is formed and a cross-sectional structure of a region HPR where the p-channel core transistor is formed are shown. In the region ATFR, a cross-sectional structure of a region ANR where the n-channel input/output transistor is formed and a cross-sectional structure of a region APR where the p-channel input/output transistor is formed are shown.

Next, into the region APR of the region ATFR, an n-channel impurity is implanted to form an N-well ANW to a predetermined depth from the surface of the semiconductor substrate SB. Also, into the region HPR of the region HTFR, an n-type impurity is implanted to form an N-well HNW to a predetermined depth from the surface of the semiconductor substrate SB.

Next, thermal oxidation treatment is performed to form the gate oxide film GZ over the surface of the semiconductor substrate SB in each of the regions MCFR, HTFR, and ATFR. At this time, by combining the thermal oxidation treatment with the removal of the thermal oxide film (gate oxide film), the gate oxide film GZ in the region ATFR where the input/output transistors are to be formed is formed to be thicker than the gate oxide films GZ formed in the regions MCFR and HTFR.

Next, a polysilicon film TS1 is formed so as to cover the gate oxide film GZ. Next, into the region ANR of the region ATFR, a p-type impurity is implanted to form a P-well APW to a predetermined depth from the surface of the semiconductor substrate SB. Then, into the region HNR of the region HTFR, a p-type impurity is implanted to form a P-well HPW to a predetermined depth from the surface of the semiconductor substrate SB. Then, into the region MCFR, a p-type impurity is implanted to form a P-well MPW to a predetermined depth from the surface of the semiconductor substrate SB.

Next, a polysilicon film TS2 is formed so as to cover the polysilicon film TS1. Then, into the polysilicon films TS1 and TS2 located in the region MCFR, an n-type impurity is implanted. Then, by performing predetermined photoengraving treatment, a resist pattern (not shown) for forming the control gate electrodes of the memory cell transistors by patterning is formed.

Figure 5:
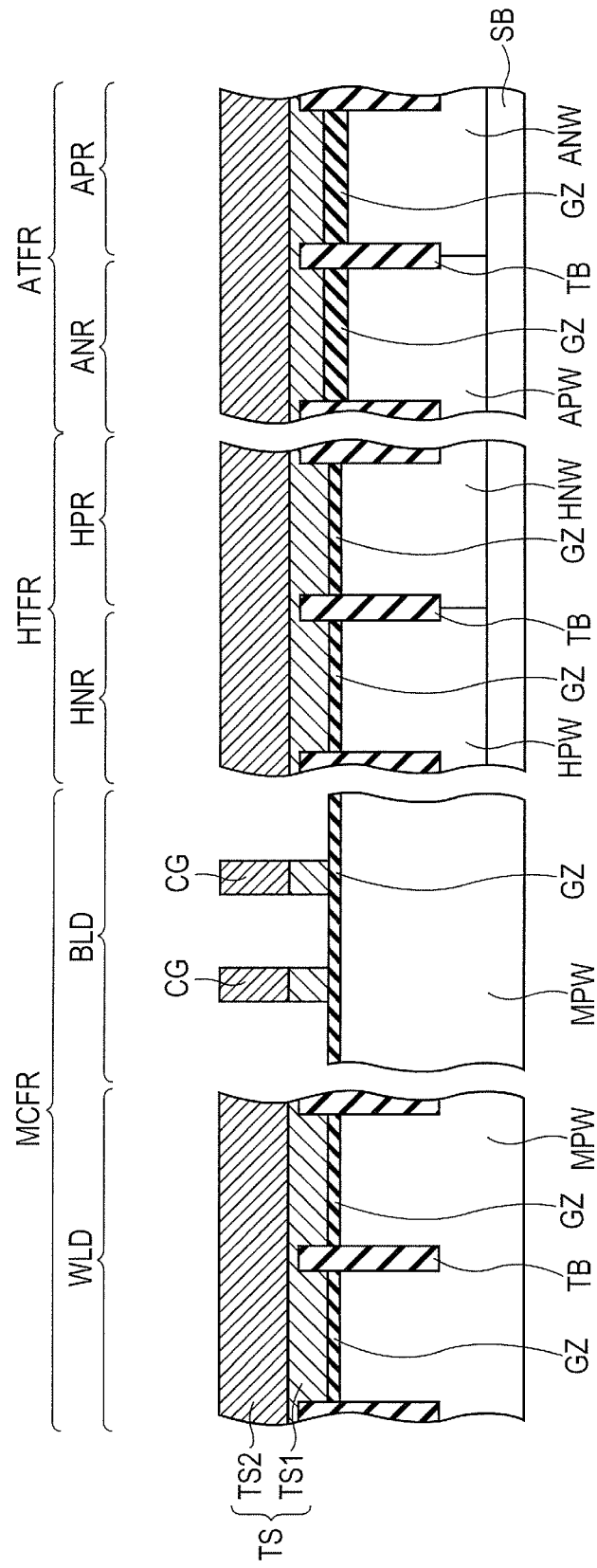
FIG. 5 is a cross-sectional view showing a step performed after the step shown in FIG. 4 in Embodiment 1.

Next, using the resist pattern as a mask, the polysilicon films TS (TS1 and TS2) are subjected to etching treatment to form the control gate electrodes CG (see FIG. 5). Thereafter, the resist pattern is removed to expose the control gate electrodes CG, as shown in FIG. 5. Next, over the side walls of the control gate electrodes CG or the like, sidewall oxide films (not shown) are formed. Then, using the control gate electrodes CG as a mask, an impurity for adjusting a threshold voltage is implanted into the region MCFR.

Figure 6:
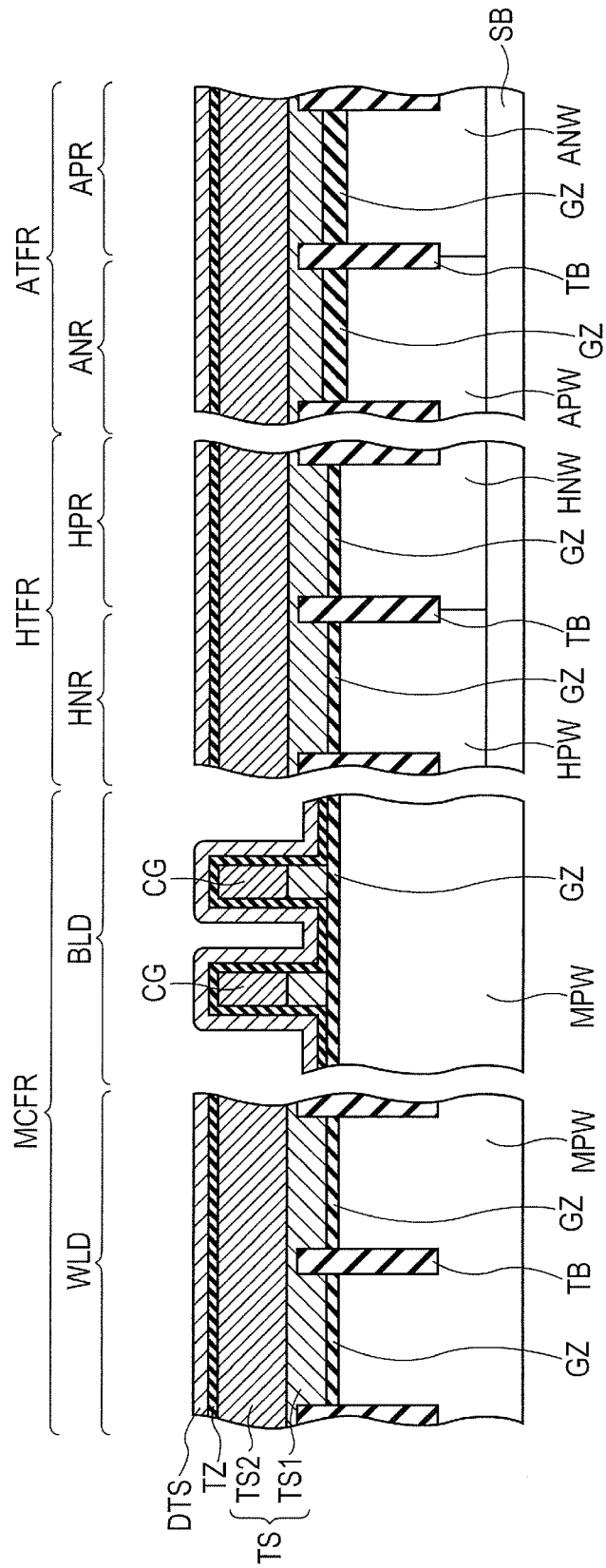
FIG. 6 is a cross-sectional view showing a step performed after the step shown in FIG. 5 in Embodiment 1.
Figure 7:
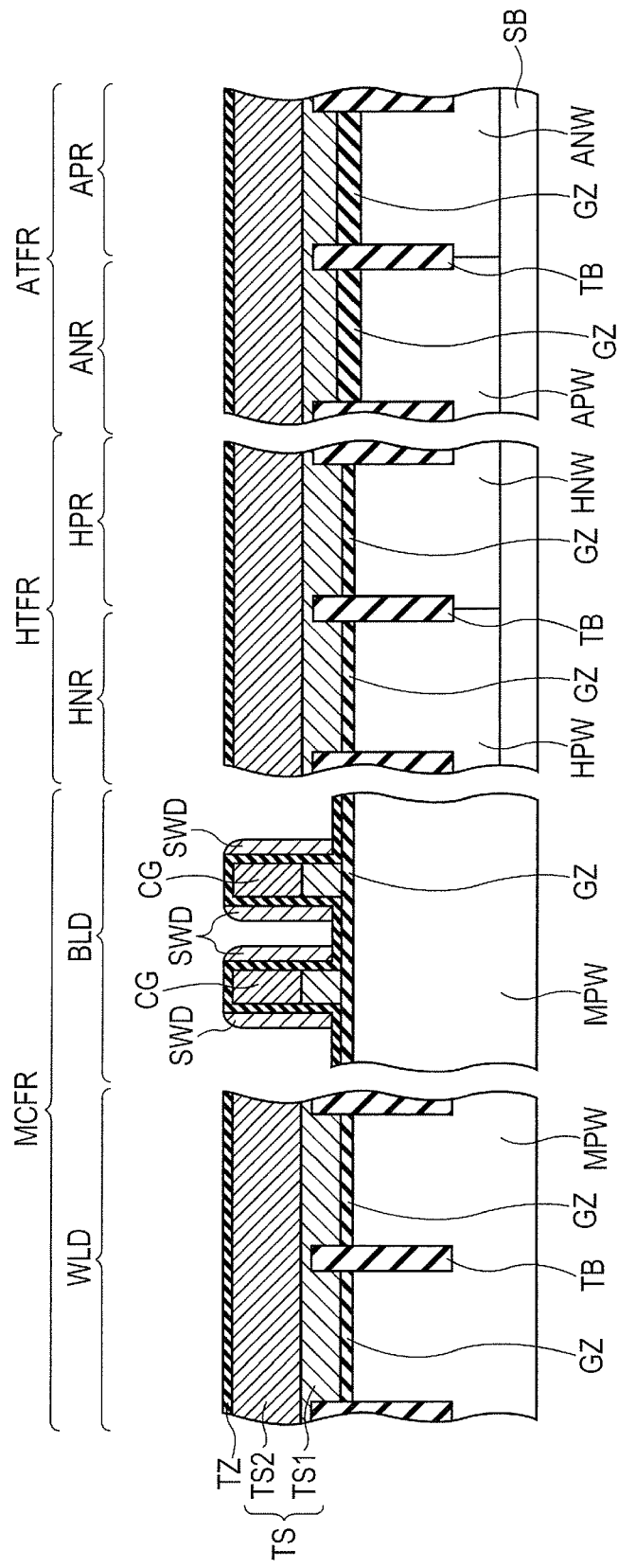
FIG. 7 is a cross-sectional view showing a step performed after the step shown in FIG. 6 in Embodiment 1.

Next, by repeating oxidation treatment, nitridation treatment, and the like, as shown in FIG. 6, the ONO film TZ comprised of the laminate film including the silicon oxide film, the silicon nitride film, and the silicon oxide film is formed so as to cover the control gate electrodes CG. Then, a doped polysilicon film DTS is formed so as to cover the ONO film. Then, anisotropic etching treatment is performed on the entire surface of the doped polysilicon film DTS to remove the portions of the doped polysilicon film DTS located over the upper surfaces of the control gate electrodes CG and the like, while leaving the portions of the doped polysilicon film DTS located over the side walls of the control gate electrodes CG, as shown in FIG. 7. Thus, over the side walls of the control gate electrodes CG, sidewall doped polysilicon films SWD are formed.

Figure 8:
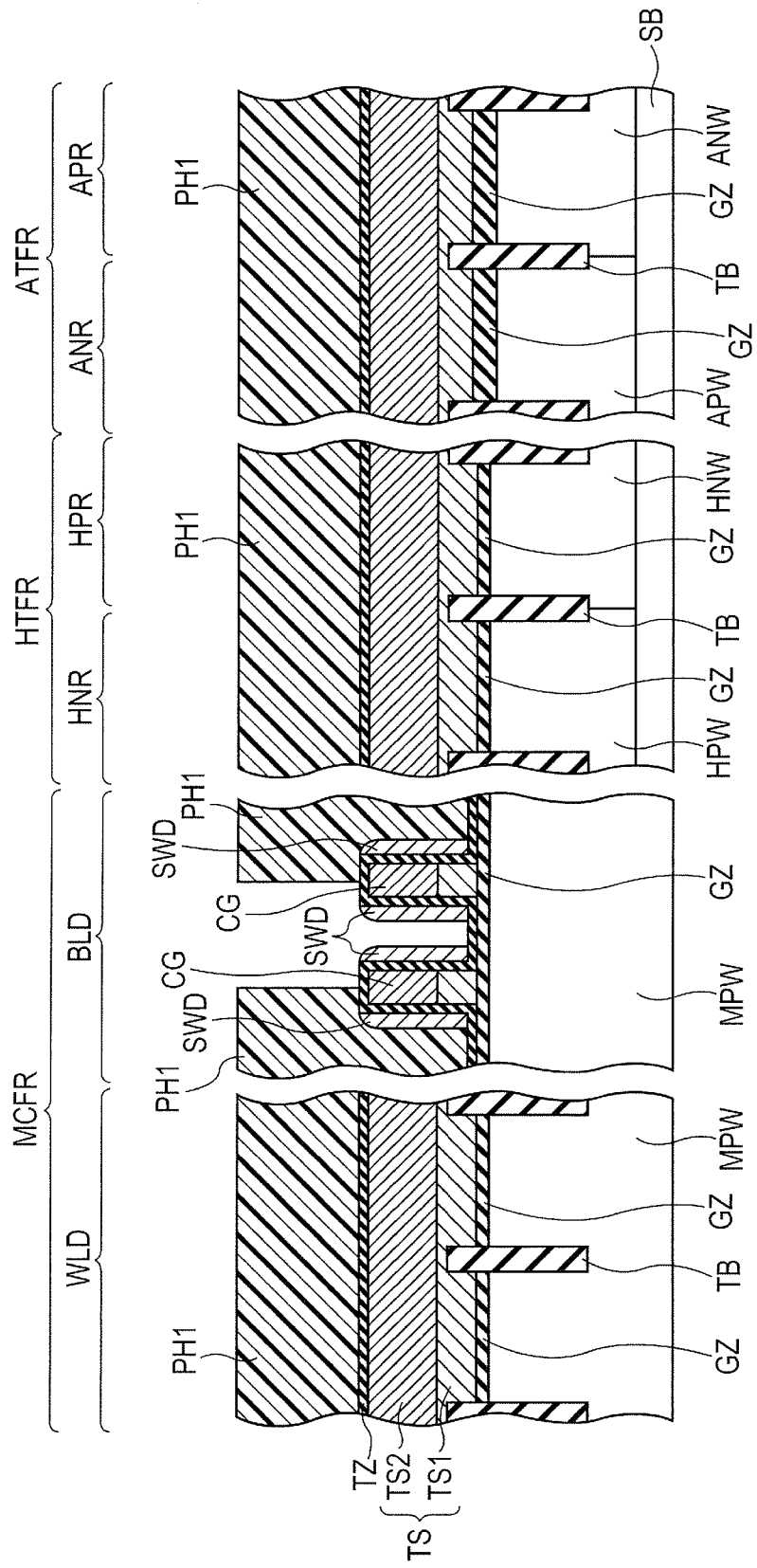
FIG. 8 is a cross-sectional view showing a step performed after the step shown in FIG. 7 in Embodiment 1.
Figure 9:
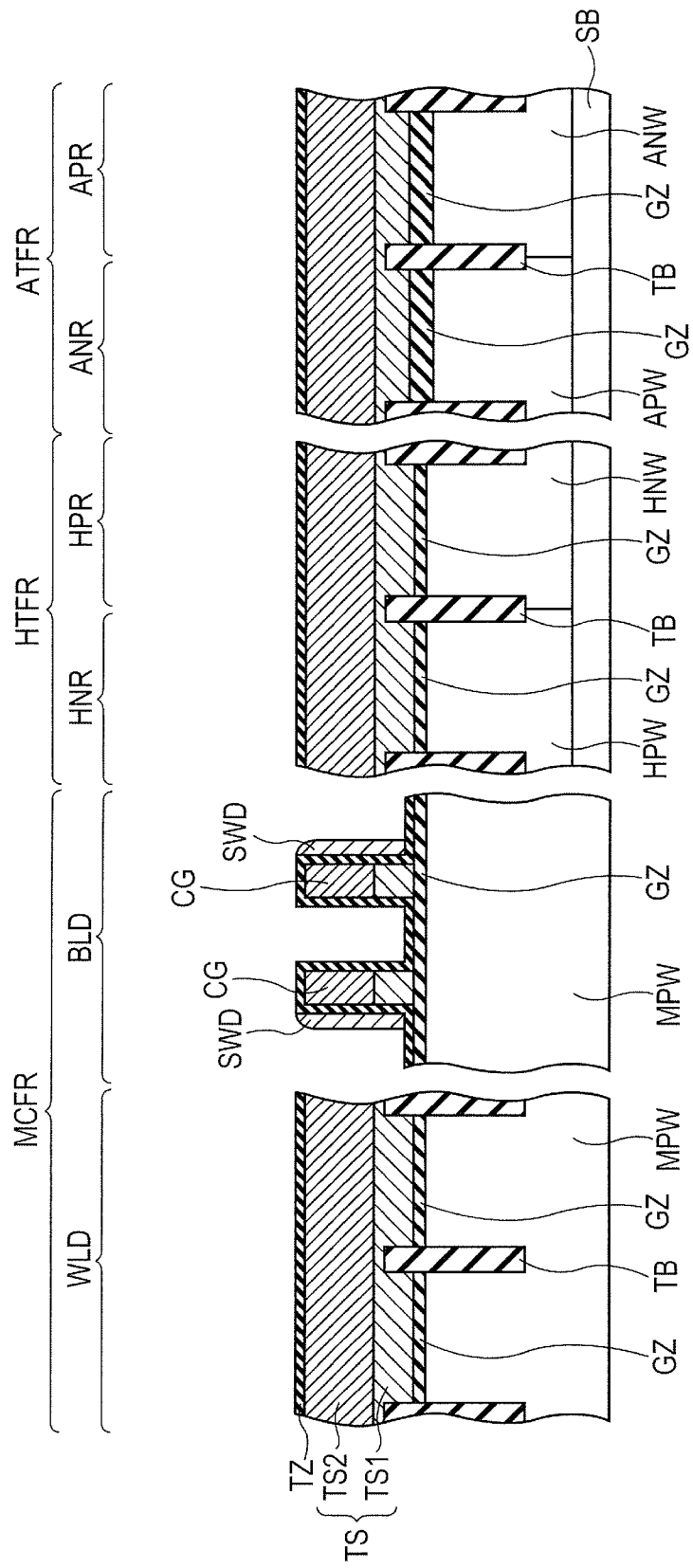
FIG. 9 is a cross-sectional view showing a step performed after the step shown in FIG. 8 in Embodiment 1.

Next, as shown in FIG. 8, a photoresist pattern PH1 is formed which covers the sidewall doped polysilicon film SWD formed over one of the both side walls of each of the control gate electrodes CG over which the respective sidewall doped polysilicon films SWD are formed, while exposing the sidewall doped polysilicon film SWD formed over the other side wall of the control gate electrode CG. Then, using the photoresist pattern PH1 as a mask, etching treatment is performed on the exposed sidewall doped polysilicon film SWD to remove the exposed sidewall doped polysilicon film SWD. Thereafter, the photoresist pattern PH1 is removed to expose the sidewall doped polysilicon film SWD left over the one side wall of the control gate electrode CG, as shown in FIG. 9.

Figure 10:
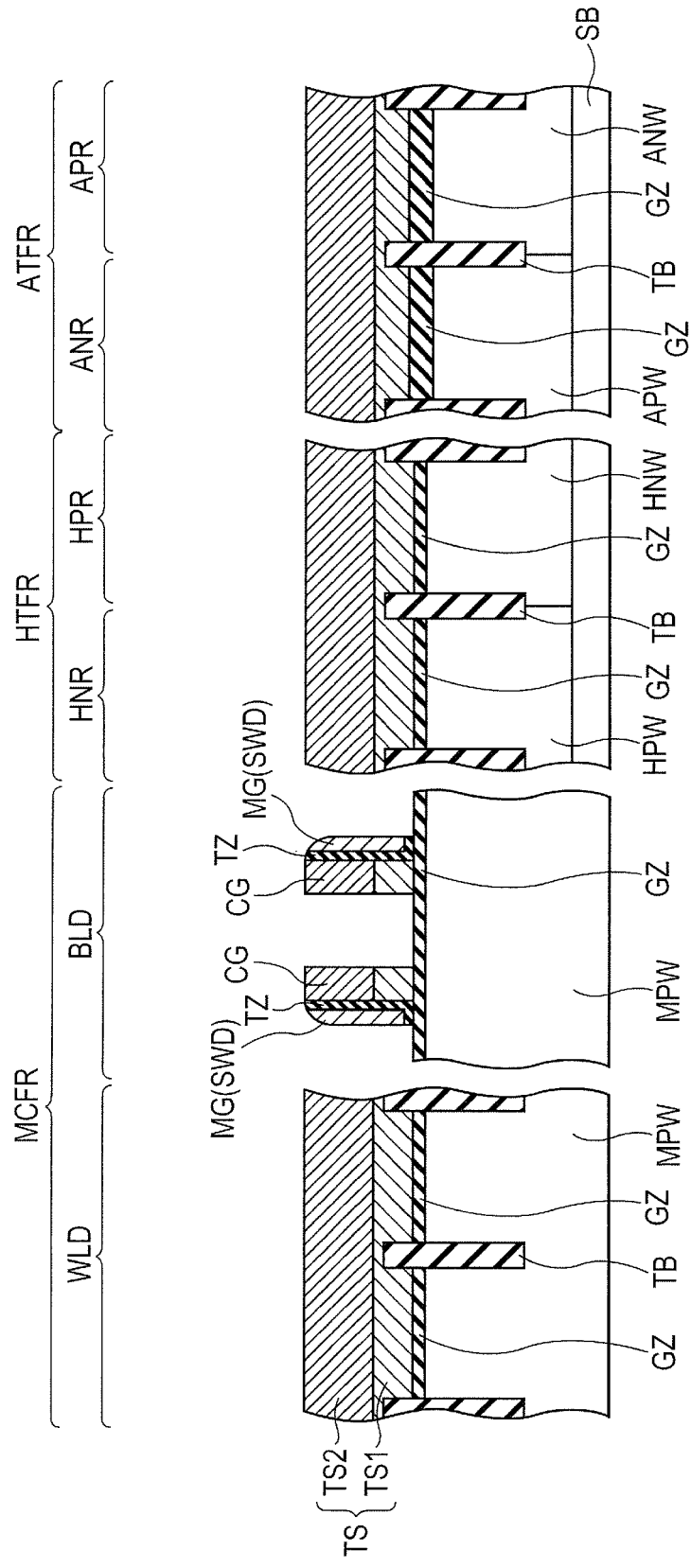
FIG. 10 is a cross-sectional view showing a step performed after the step shown in FIG. 9 in Embodiment 1.
Figure 11:
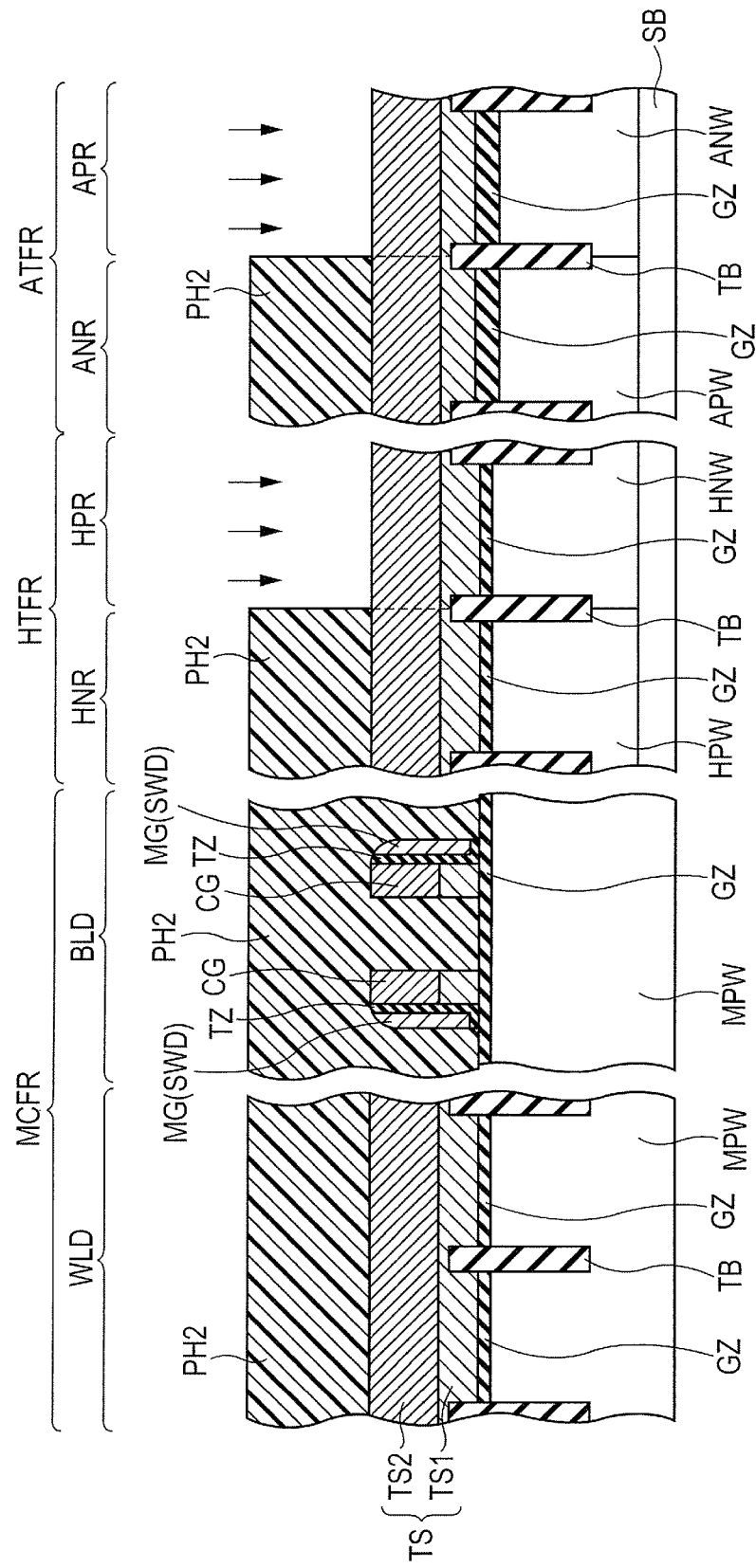
FIG. 11 is a cross-sectional view showing a step performed after the step shown in FIG. 10 in Embodiment 1.

Next, predetermined etching treatment is performed to thereby remove the exposed portions of the ONO film TZ, as shown in FIG. 10. The sidewall doped polysilicon film SWD left over the one side wall of each of the control gate electrodes CG with the ONO film TZ being interposed therebetween serves as the memory gate electrode MG. Then, as shown in FIG. 11, a photoresist pattern PH2 is formed which exposes the region HPR of the region HTFR and the region APR of the region ATFR and covers the region HNR, the region ANR, and the like. Then, using the photoresist pattern PH2 as a mask, a p-type impurity is implanted into the exposed polysilicon films PS1 and PS2. Thereafter, the photoresist pattern PH2 is removed.

Figure 12:
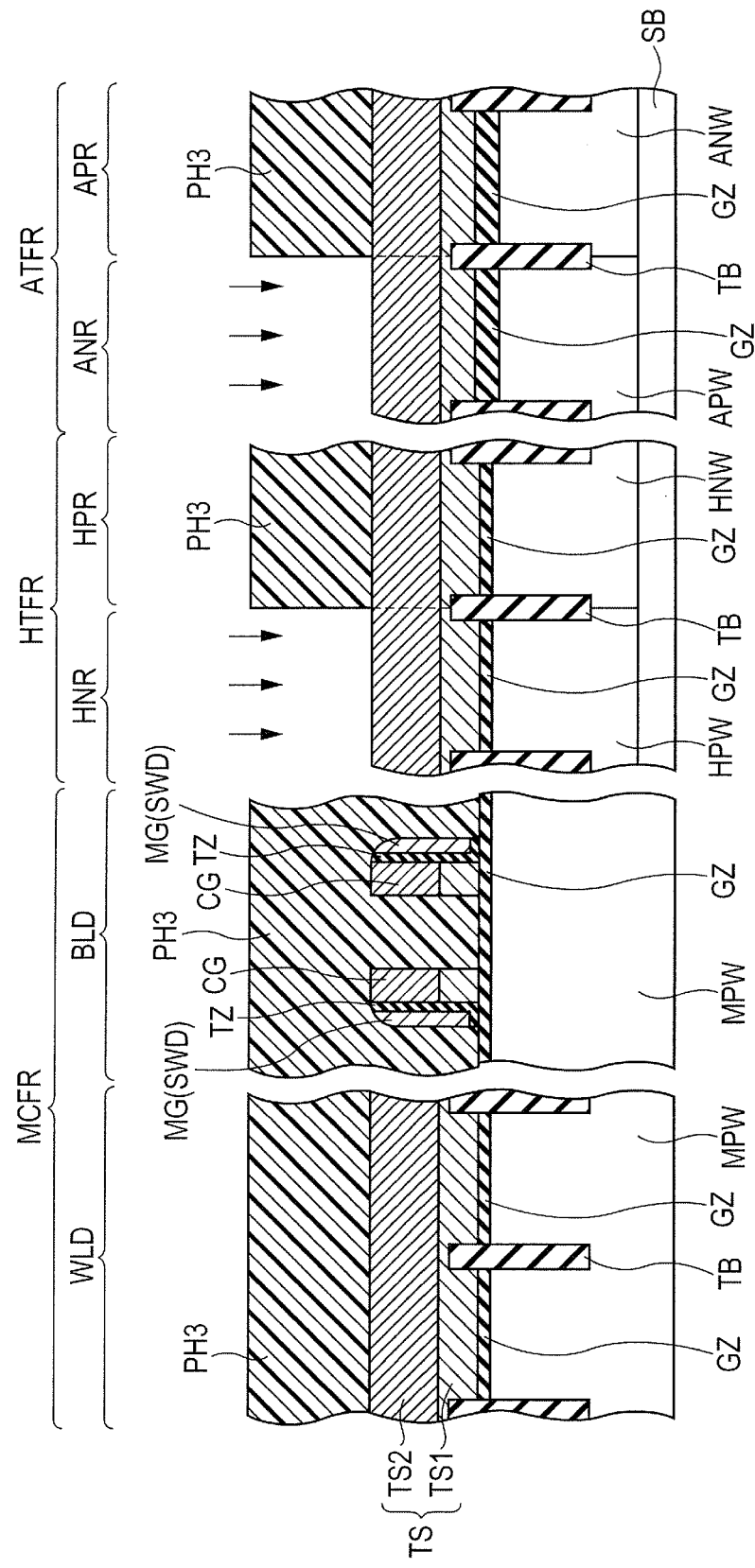
FIG. 12 is a cross-sectional view showing a step performed after the step shown in FIG. 11 in Embodiment 1.
Figure 13:
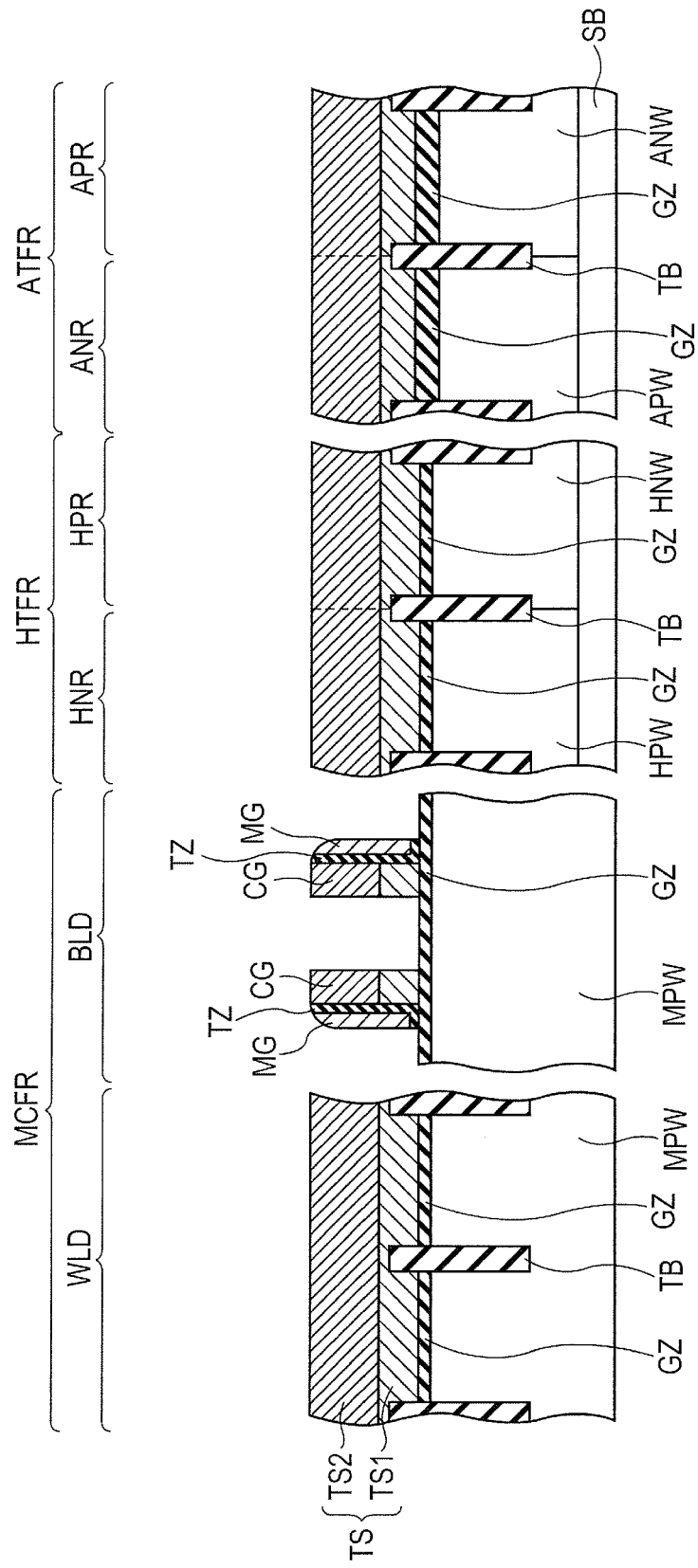
FIG. 13 is a cross-sectional view showing a step performed after the step shown in FIG. 12 in Embodiment 1.

Next, as shown in FIG. 12, a photoresist pattern PH3 is formed which exposes the region HNR of the region HTFR and the region ANR of the region ATFR and covers the region HPR, the region APR, and the like. Then, using the photoresist pattern PH3 as a mask, an n-type impurity is implanted into the exposed polysilicon films TS. Thereafter, the photoresist pattern PH3 is removed to expose the surface of the polysilicon film PS2 and the like, as shown in FIG. 13.

Figure 14:
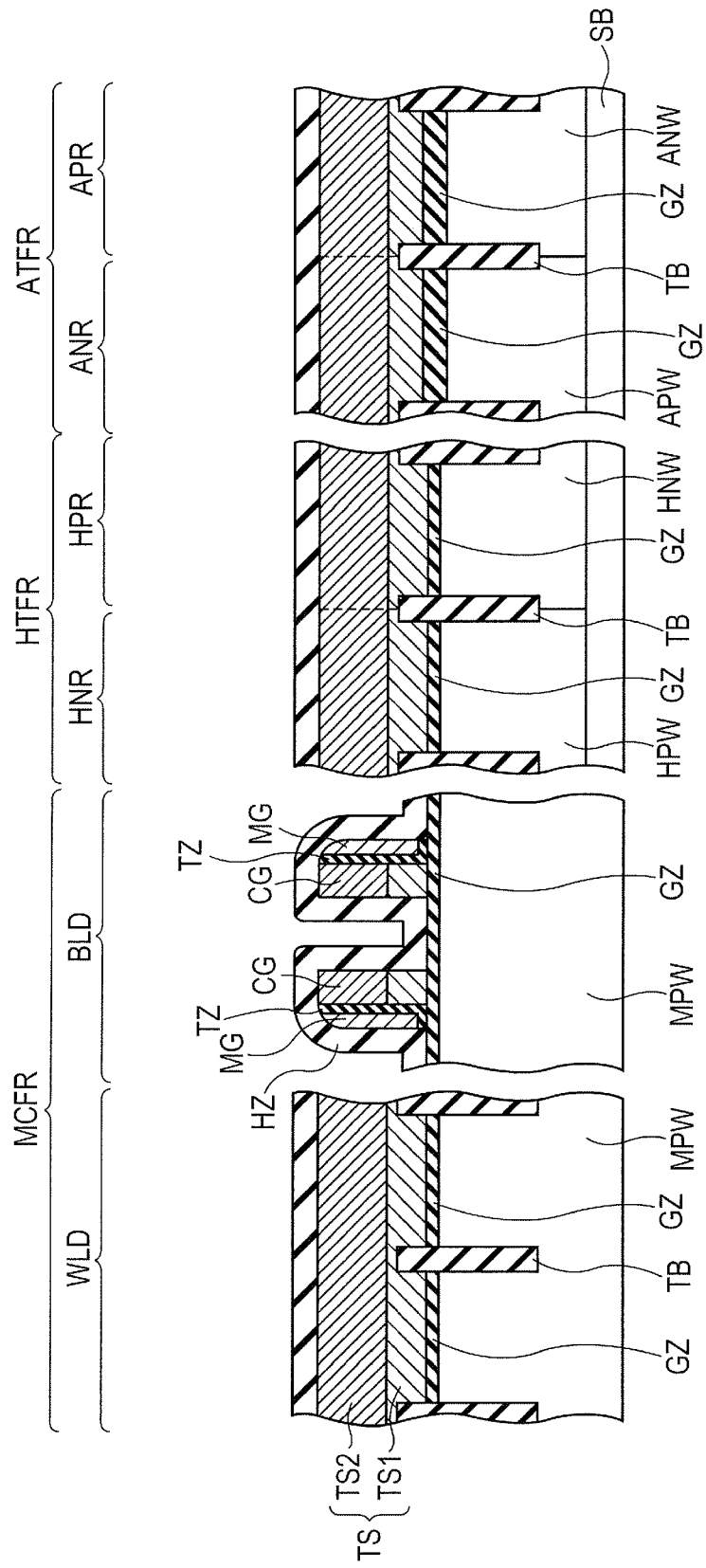
FIG. 14 is a cross-sectional view showing a step performed after the step shown in FIG. 13 in Embodiment 1.
Figure 15:
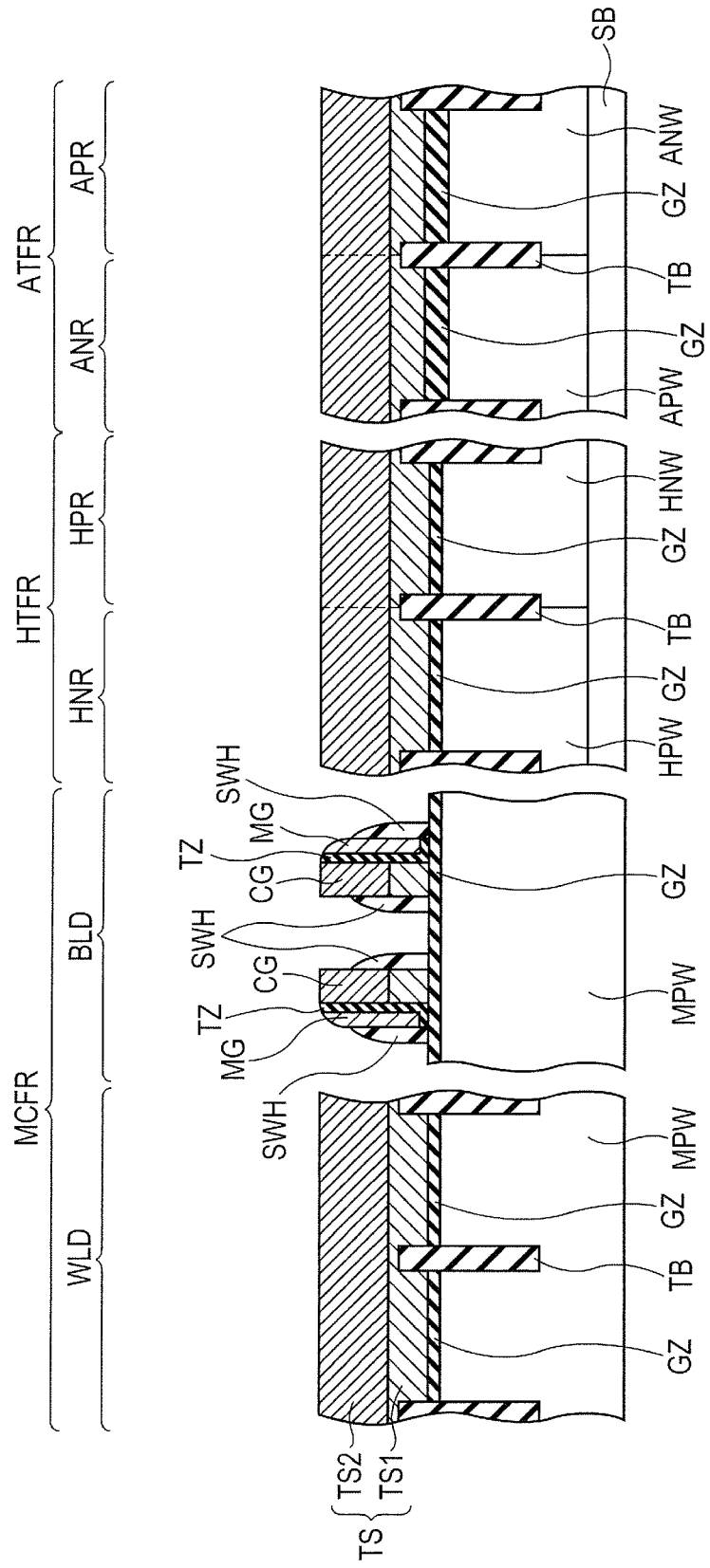
FIG. 15 is a cross-sectional view showing a step performed after the step shown in FIG. 14 in Embodiment 1.

Next, as shown in FIG. 14, by, e.g., a chemical vapor deposition method, a high-temperature oxide film HZ is formed so as to cover the control gate electrodes CG and the memory gate electrodes MG. The high-temperature oxide film HZ is called a HTO (High Temperature Oxide) film. Next, anisotropic etching treatment is performed on the entire surface of the high-temperature oxide film HZ to remove the portions of the high-temperature oxide film HZ located over the upper surfaces of the control gate electrodes CG, the memory gate electrodes MG, and the like, while leaving the portions of the high-temperature oxide film HZ located over the side walls of the memory gate electrodes MG and the portions of the high-temperature oxide film HZ located over the side walls of the control gate electrodes CG, as shown in FIG. 15. Thus, sidewall high-temperature oxide films SWH as the offset spacers are formed.

Figure 16:
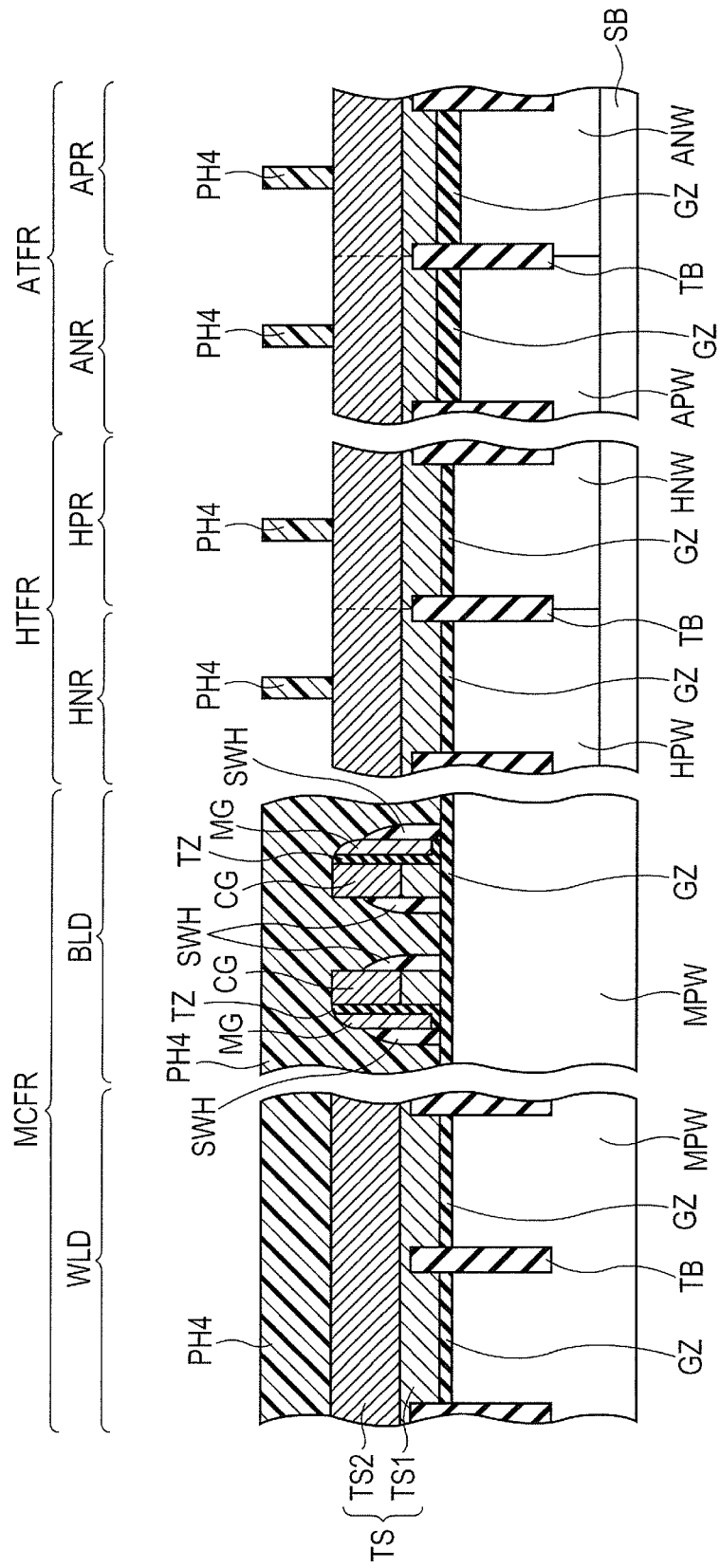
FIG. 16 is a cross-sectional view showing a step performed after the step shown in FIG. 15 in Embodiment 1.

Next, as shown in FIG. 16, predetermined photoengraving treatment is performed to form a photoresist pattern PH4 for forming the gate electrodes of the core transistors in the region HTFR and forming the gate electrodes of the input/output transistors in the region ATFR, each by patterning.

Figure 17:
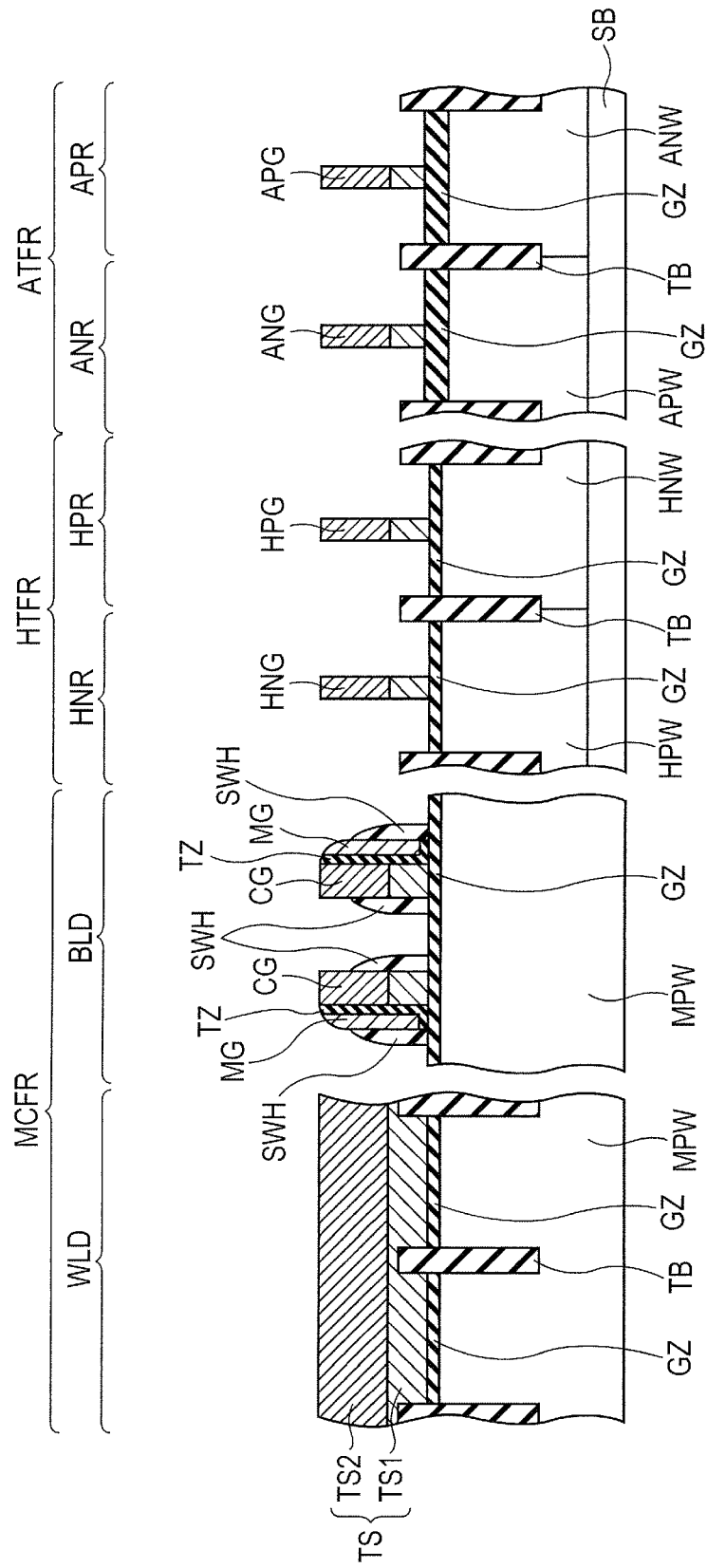
FIG. 17 is a cross-sectional view showing a step performed after the step shown in FIG. 16 in Embodiment 1.

Next, using the photoresist pattern PH4 as a mask, etching treatment is performed on the polysilicon films PS2 and PS1 to form a gate electrode HNG in the region HNR of the region HTFR and form a gate electrode HPG in the region HPR thereof (see FIG. 17). Meanwhile, in the region ANR of the region ATFR, a gate electrode ANG is formed and, in the region APR thereof, a gate electrode APG is formed (see FIG. 17). Thereafter, the photoresist pattern PH4 is removed to expose the gate electrodes HNG, HPG, ANG, and APG, as shown in FIG. 17. Subsequently, sidewall oxide films (not shown) are formed over the side walls of the gate electrodes HNG, HPG, ANG, and APG and the like.

Figure 18:
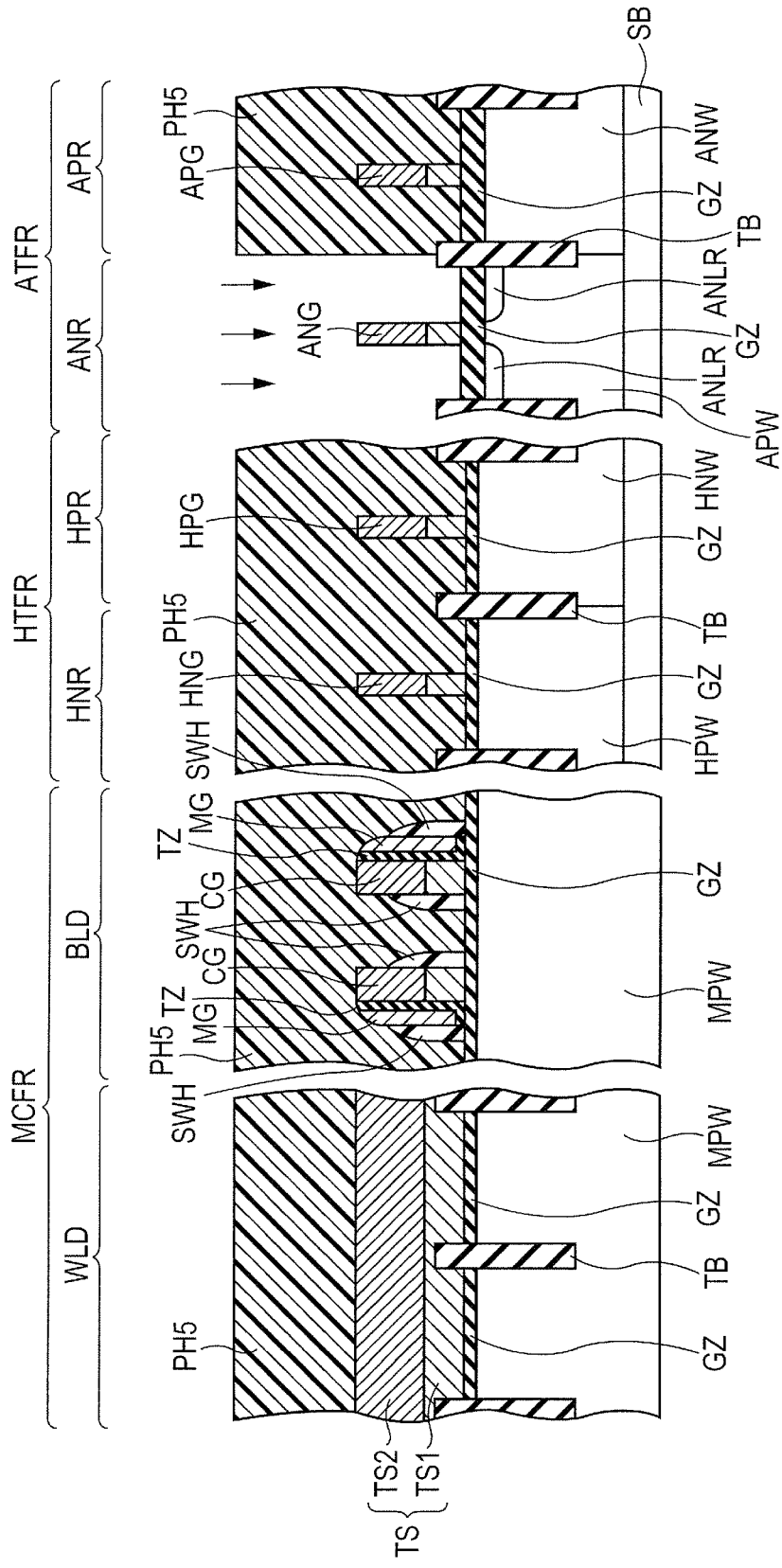
FIG. 18 is a cross-sectional view showing a step performed after the step shown in FIG. 17 in Embodiment 1.

Next, as shown in FIG. 18, a photoresist pattern PH5 is formed which exposes the region ANR of the region ATFR and covers the regions APR, HTFR, and MCFR. Then, using the photoresist pattern PH5 and the gate electrode ANG as a mask, an n-type impurity is implanted into the exposed region ANR to form a pair of LDD (Lightly Doped Drain) regions ANLR. Then, the photoresist pattern PH5 is removed. Thereafter, annealing treatment is performed at a predetermined temperature.

Figure 19:
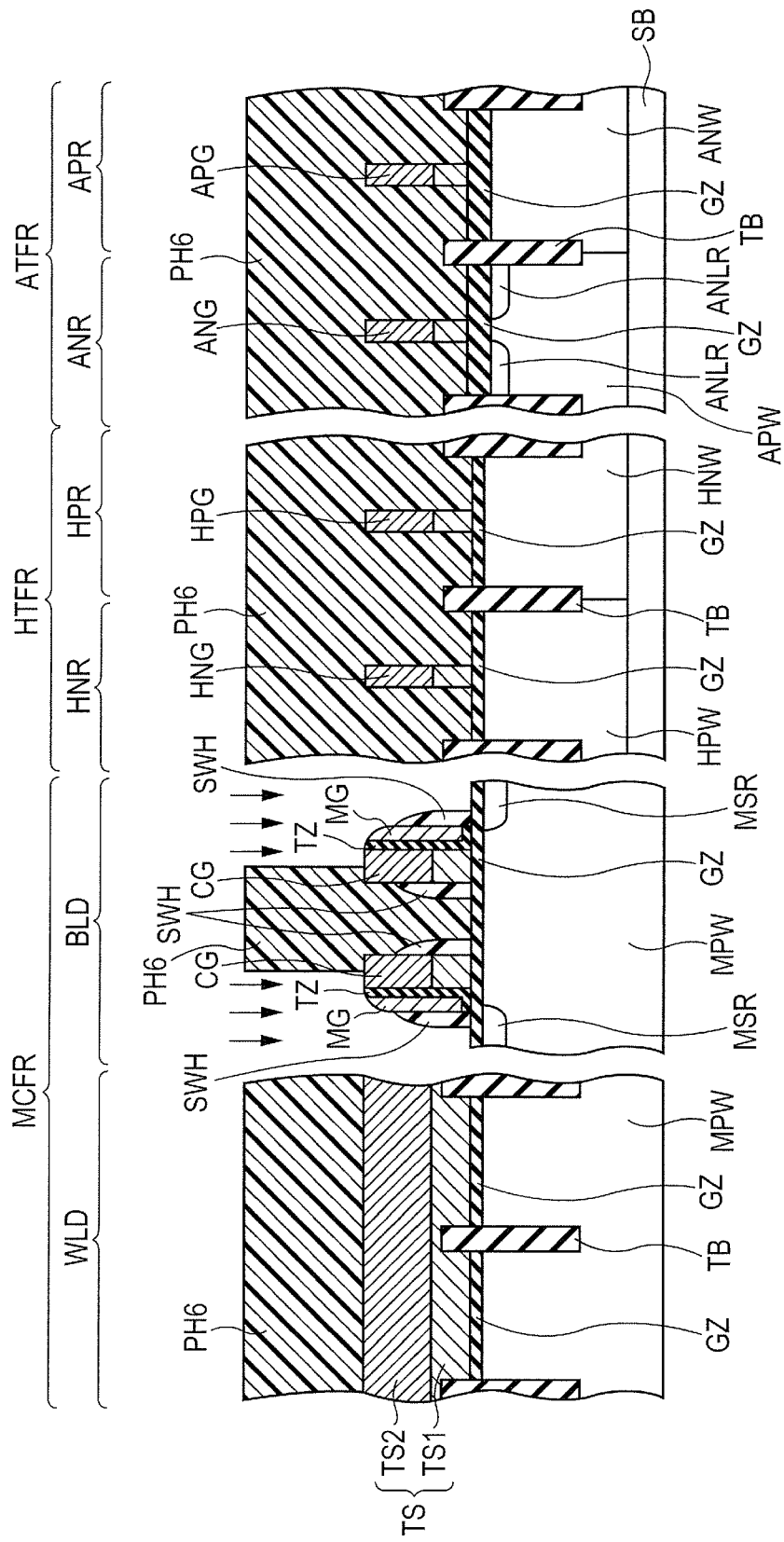
FIG. 19 is a cross-sectional view showing a step performed after the step shown in FIG. 18 in Embodiment 1.

Next, a photoresist pattern for forming the memory source regions is formed. As shown in FIG. 19, a photoresist pattern PH6 is formed so as to expose the portion of the P-well MPW located on the side of each of the control gate electrodes CG on which the memory gate electrode MG is formed and cover the portion of the p-well MPW on the side of each of the control gate electrodes CG on which the memory gate electrode is not formed.

Next, using the photoresist pattern PH6, the memory gate electrodes MG, the sidewall high-temperature oxide films SWH, and the like as a mask, e.g., arsenic (As) is implanted under predetermined implantation conditions (including, e.g., an implantation energy of 5 keV and a dose of $1 \times 10^{15}$ cm$^2$) to form the memory source regions MSR. At this time, using the sidewall high-temperature oxides film SWH formed over the side walls of the memory gate electrodes MG as a mask, arsenic is implanted to ensure a sufficient gate length for each of the memory gate electrodes MG, which will be described later in detail. Thereafter, the photoresist pattern PH6 is removed.

Figure 20:
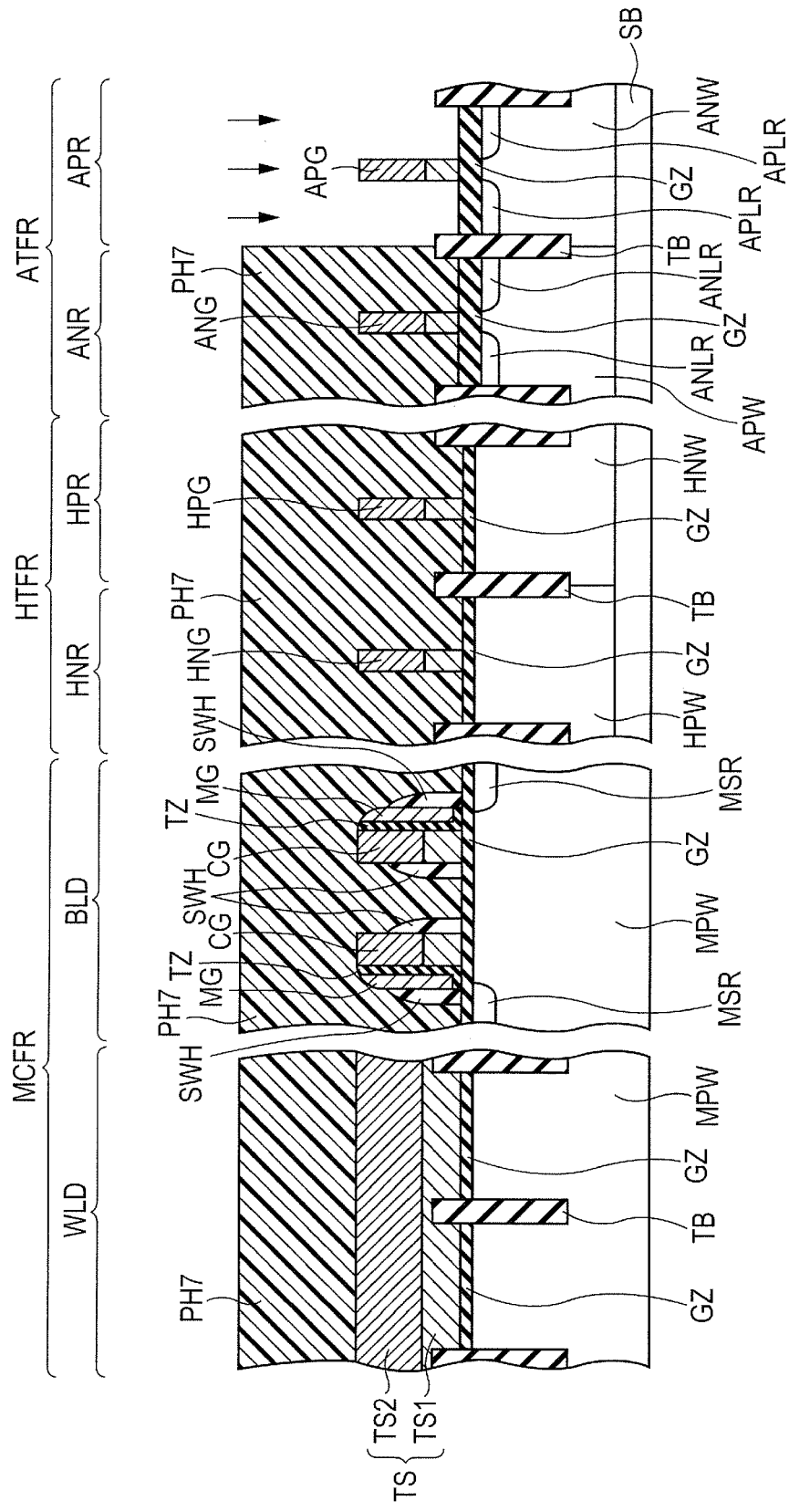
FIG. 20 is a cross-sectional view showing a step performed after the step shown in FIG. 19 in Embodiment 1.

Next, as shown in FIG. 20, a photoresist pattern PH7 is formed which exposes the region APR of the region ATFR and covers the regions ANR, HTFR, and MCFR. Then, using the photoresist pattern PH7 and the gate electrode APG as a mask, a p-type impurity is implanted into the exposed region APR to form a pair of LDD regions APLR. Then, the photoresist pattern PH7 is removed.

Figure 21:
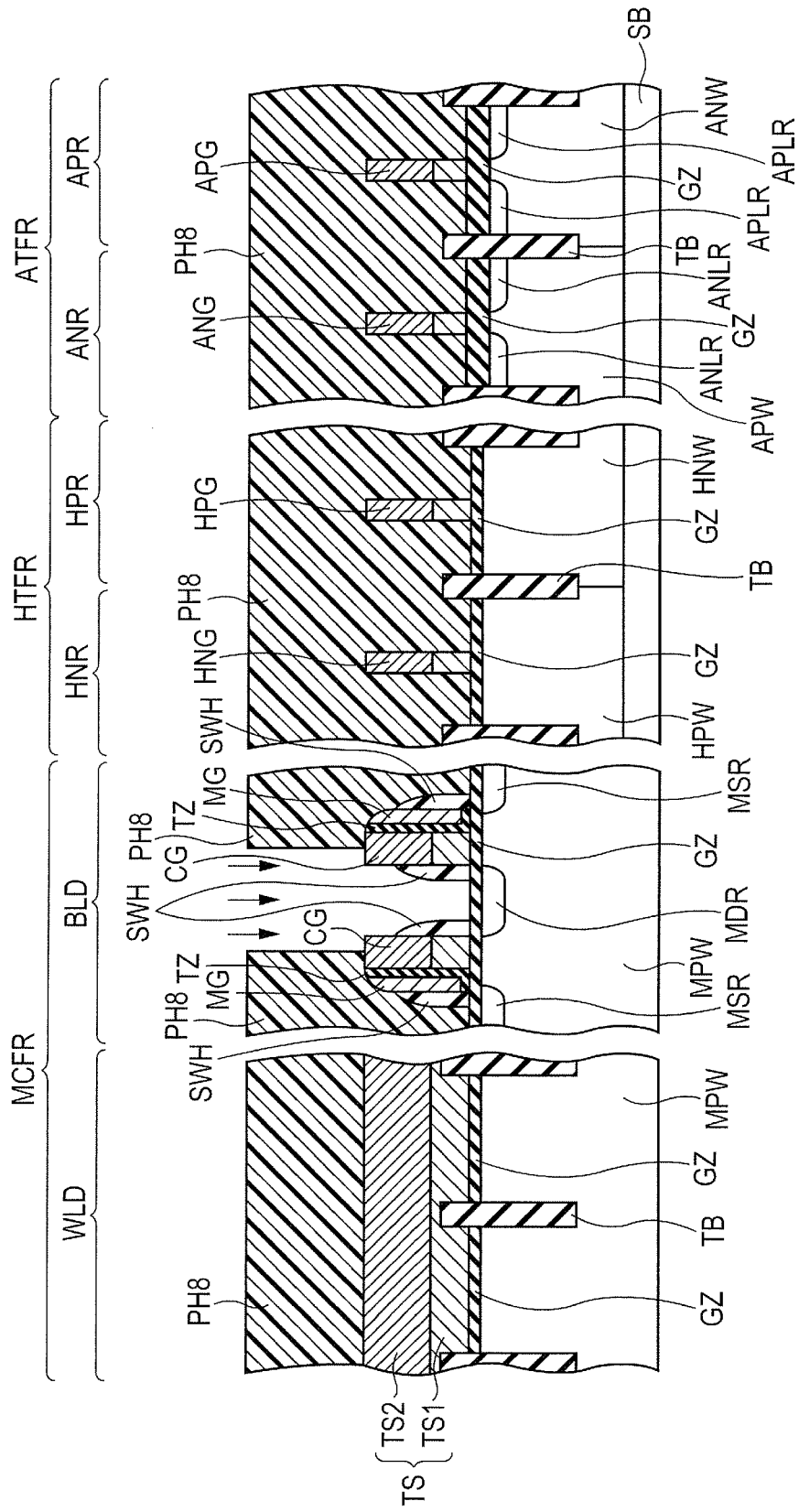
FIG. 21 is a cross-sectional view showing a step performed after the step shown in FIG. 20 in Embodiment 1.

Next, a photoresist pattern for forming the memory drain region is formed. As shown in FIG. 21, a photoresist pattern PH8 is formed so as to expose the portion of the p-well PMW located on the side of each of the control gate electrodes CG on which the memory gate electrode MG is not formed and cover the portion of the P-well MPW located on the side on which the memory gate electrode is formed.

Next, using the photoresist pattern PH8, the sidewall high-temperature oxide films SWH, and the like as a mask, e.g., arsenic (As) is implanted under predetermined implantation conditions (including, e.g., an implantation energy of 7 keV and a dose of $1 \times 10^{15}$ cm$^2$). In addition, boron (B) is implanted under predetermined implantation conditions (including, e.g., an implantation energy of 10 keV and a dose of $1 \times 10^{13}$ cm$^2$) to form the memory drain region MDR. Note that boron is implanted to suppress a short-channel effect resulting from a reduction in electric field. It may also be possible to implant boron first and then implant arsenic. Thereafter, the photoresist pattern PH8 is removed.

Figure 22:
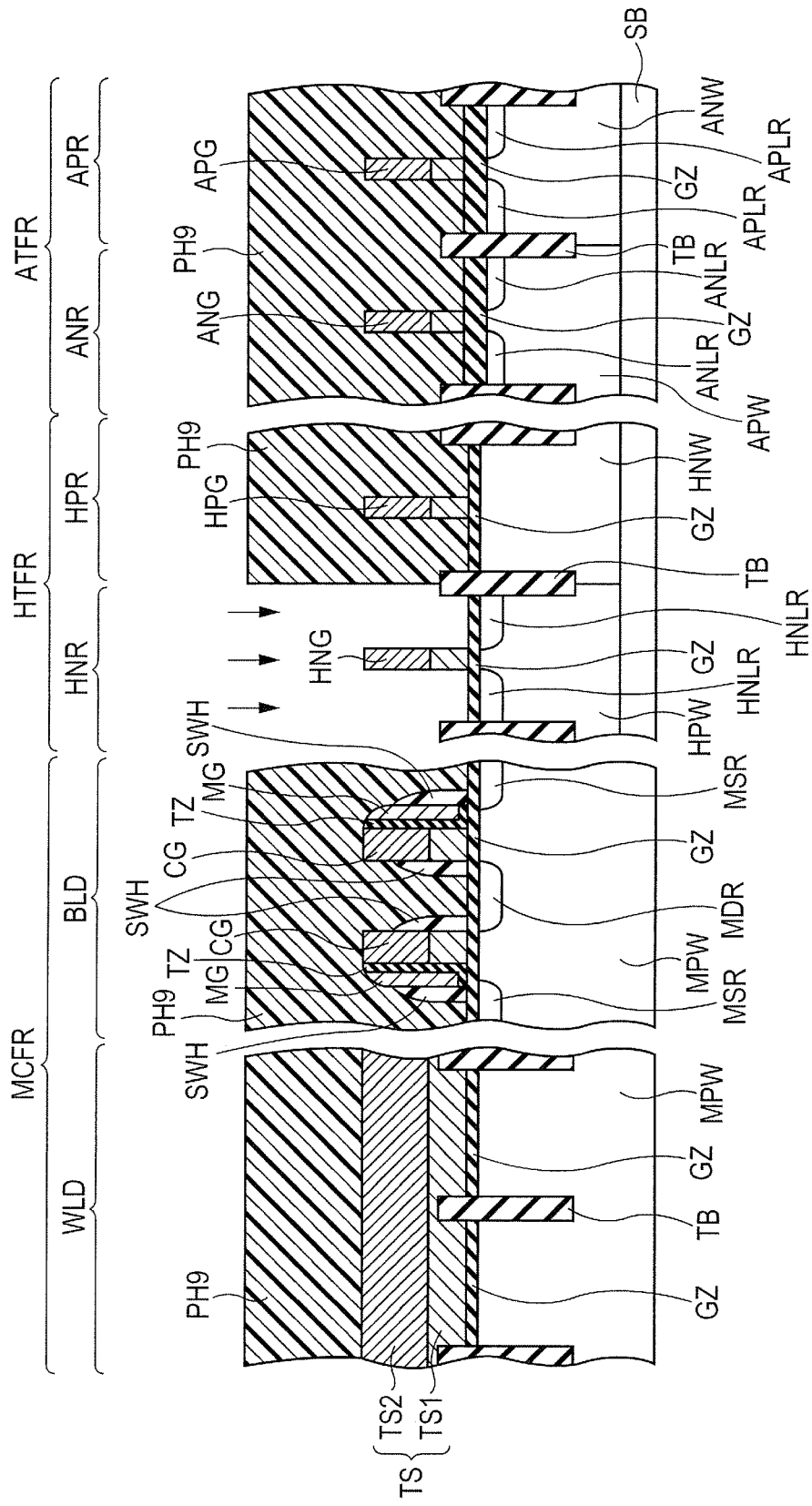
FIG. 22 is a cross-sectional view showing a step performed after the step shown in FIG. 21 in Embodiment 1.

Next, as shown in FIG. 22, a photoresist pattern PH9 is formed which exposes the region HNR of the region HTFR and covers the regions HPR, ATFR, and MCFR. Then, using the photoresist pattern PH9 and the gate electrode HNG as a mask, an n-type impurity is implanted into the exposed region HNR to form a pair of LDD regions HNLR. Thereafter, the photoresist pattern PH9 is removed.

Figure 23:
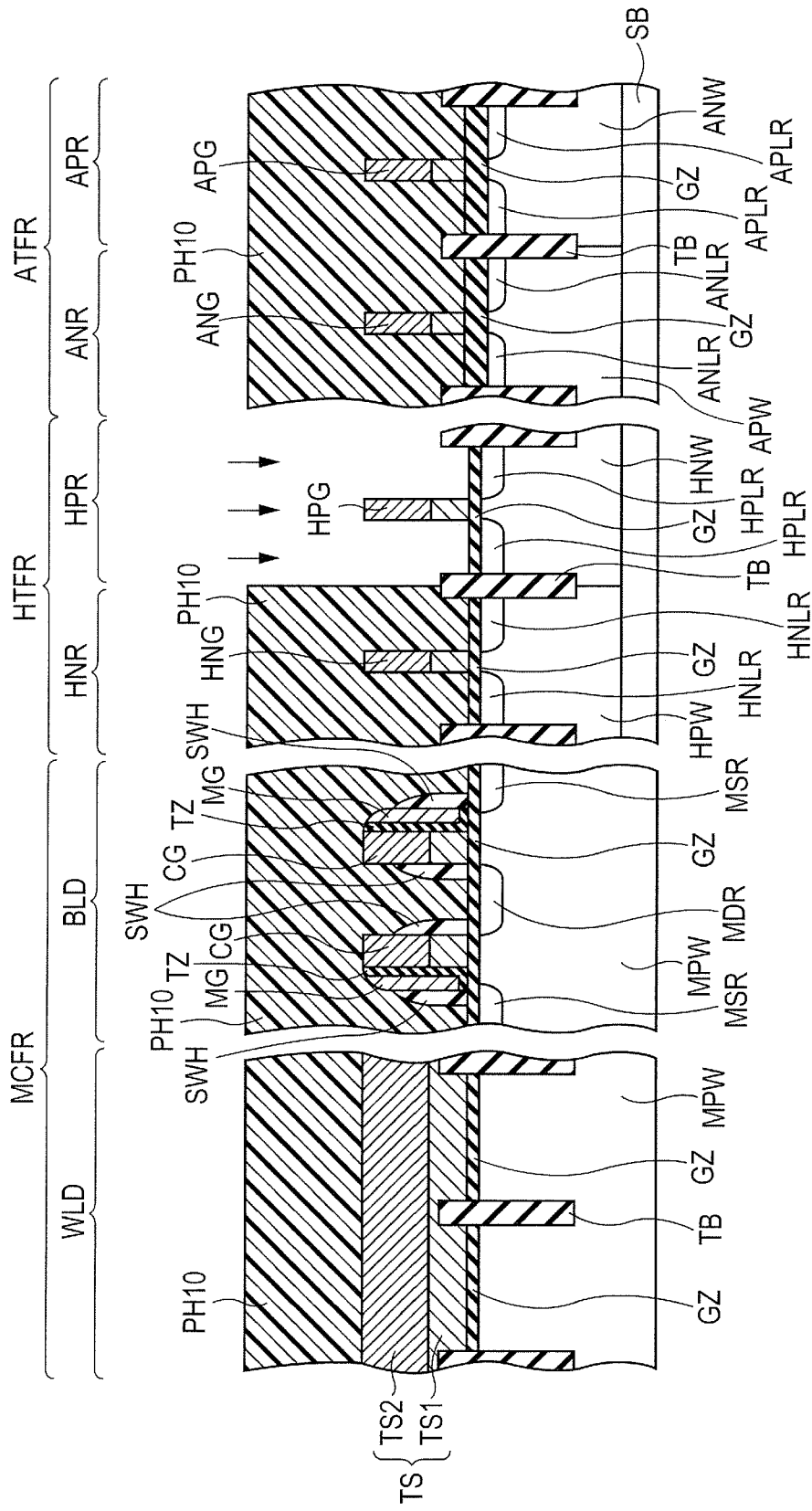
FIG. 23 is a cross-sectional view showing a step performed after the step shown in FIG. 22 in Embodiment 1.

Next, as shown in FIG. 23, a photoresist pattern PH10 is formed which exposes the region HPR of the region HTFR and covers the regions HNR, ATFR, and MCFR. Next, using the photoresist pattern PH10 and the gate electrode HPG as a mask, a p-type impurity is implanted into the exposed region HPR to form a pair of LDD regions HPLR. Thereafter, the photoresist pattern PH10 is removed.

Figure 24:
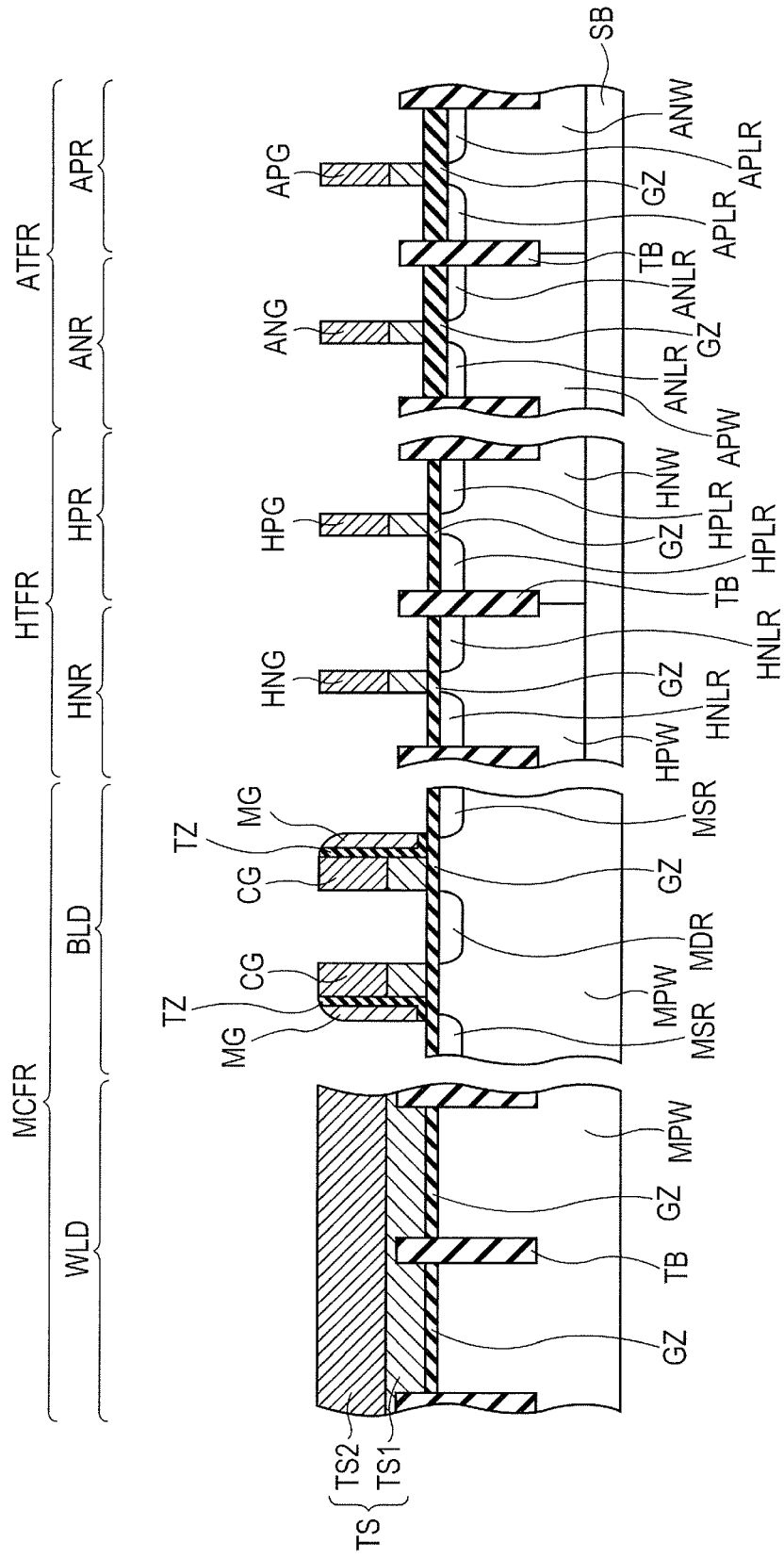
FIG. 24 is a cross-sectional view showing a step performed after the step shown in FIG. 23 in Embodiment 1.

Next, over the side walls of the control gate electrodes CG, the memory gate electrodes MG, and the gate electrodes HNG, HPG, ANG, and APG, sidewall insulating films are formed but, by this time, the sidewall high-temperature oxide films SWH disappear. That is, as shown in FIG. 24, the sidewall high-temperature oxide films SWH disappear through cleaning treatment after the photoresist patterns are removed, cleaning treatment before annealing treatment is performed, and the like to expose the side walls of the memory gate electrodes MG and the side walls of the control gate electrodes CG.

Figure 25:
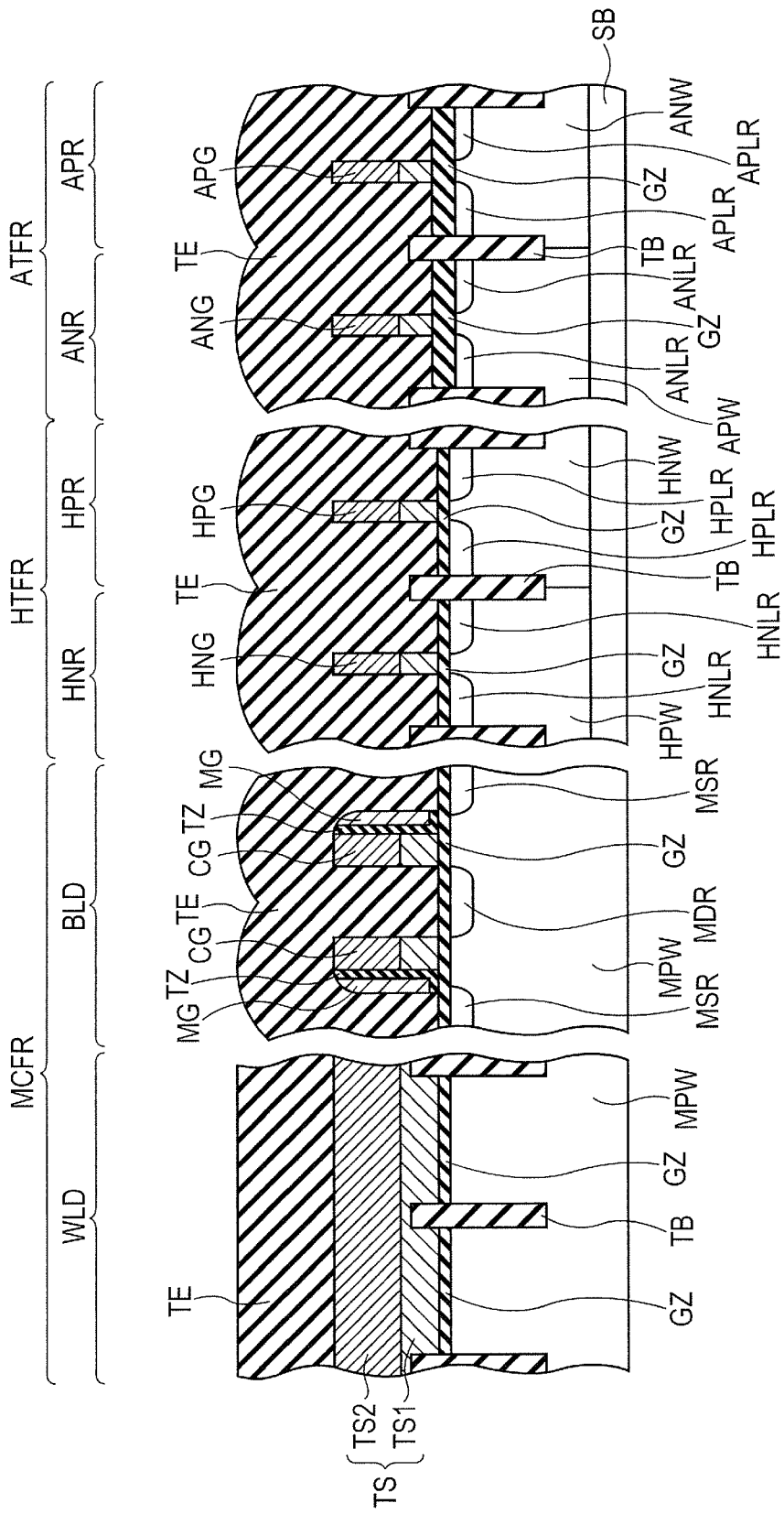
FIG. 25 is a cross-sectional view showing a step performed after the step shown in FIG. 24 in Embodiment 1.
Figure 26:
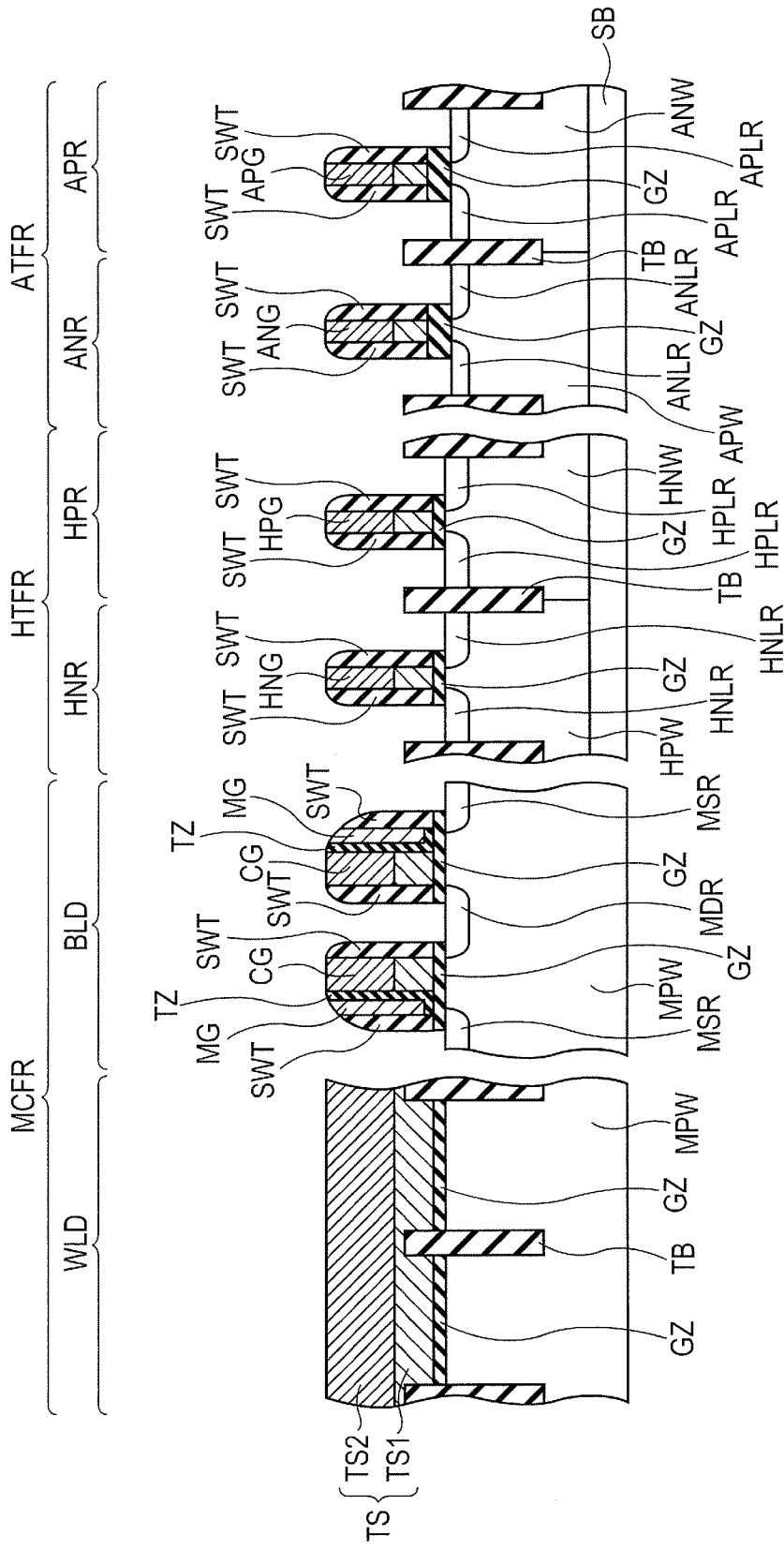
FIG. 26 is a cross-sectional view showing a step performed after the step shown in FIG. 25 in Embodiment 1.

Next, as shown in FIG. 25, a TEOS (Tetra Ethyl Ortho Silicate glass) film TE is formed by, e.g., a chemical vapor deposition method so as to cover the control gate electrodes CG, the memory gate electrodes MG, and the gate electrodes HNG, HPG, ANG, and APG. Then, anisotropic etching treatment is performed on the entire surface of the TEOS film TE to form the sidewall TEOS films SWT over the respective side walls of the control gate electrodes CG, the memory gate electrodes MG, and the gate electrodes HNG, HPG, ANG, and APG.

Figure 27:
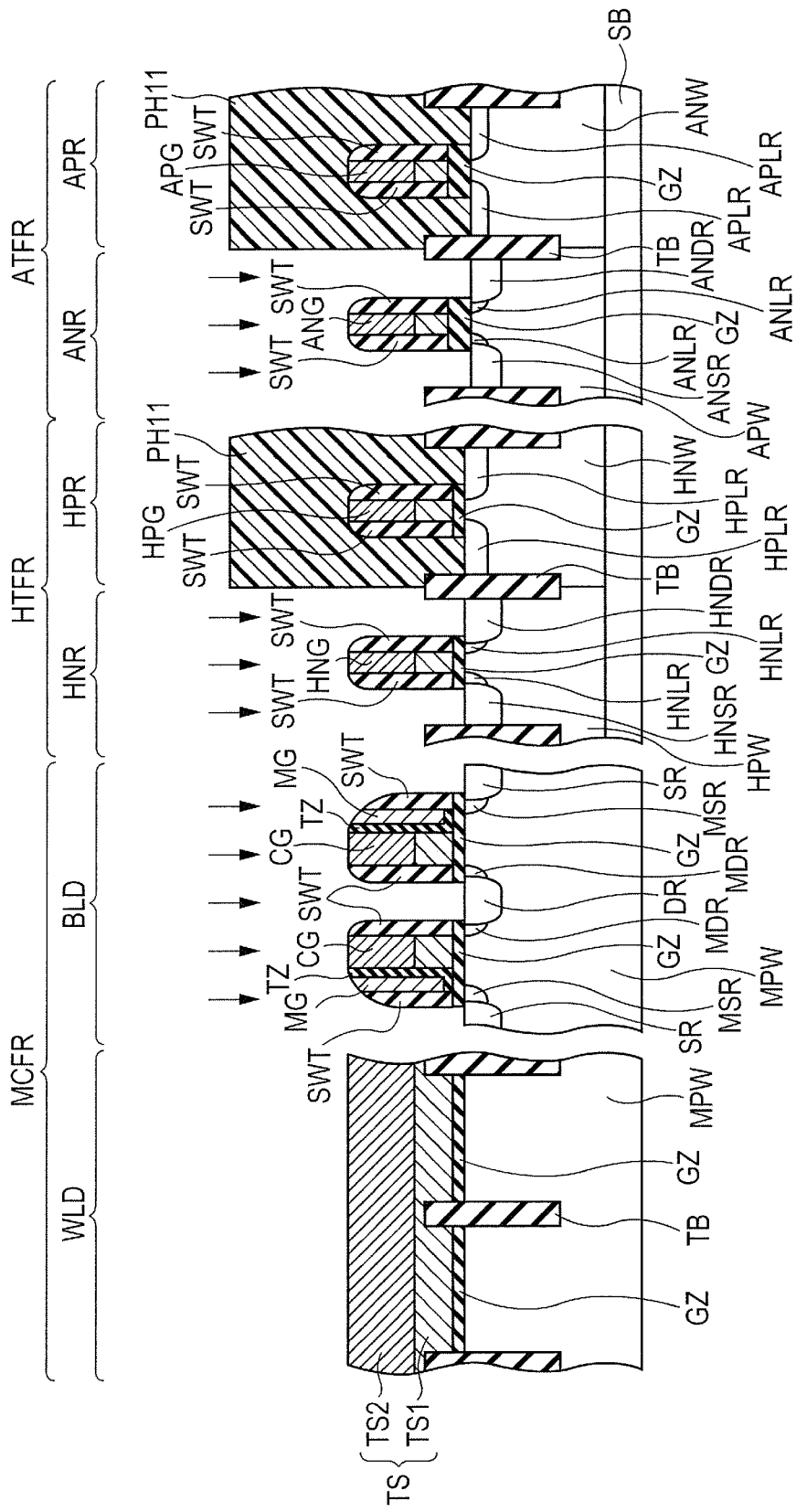
FIG. 27 is a cross-sectional view showing a step performed after the step shown in FIG. 26 in Embodiment 1.

Next, as shown in FIG. 27, a photoresist pattern PH11 is formed which exposes the region MCFR, the region HNR of the region HTFR, and the region ANR of the region AFTR and covers the region HPR of the region HTFR and the region APR of the region AFTR. Then, using the photoresist pattern PH11 and the like as a mask, an n-type impurity is implanted to form the source regions SR and the drain region DR in the region MLFR, form a source region HNSR and a drain region HNDR in the region HNR, and form a source region ANSR and a drain region ANDR in the region ANR. Thereafter, the photoresist pattern PH11 is removed.

Figure 28:
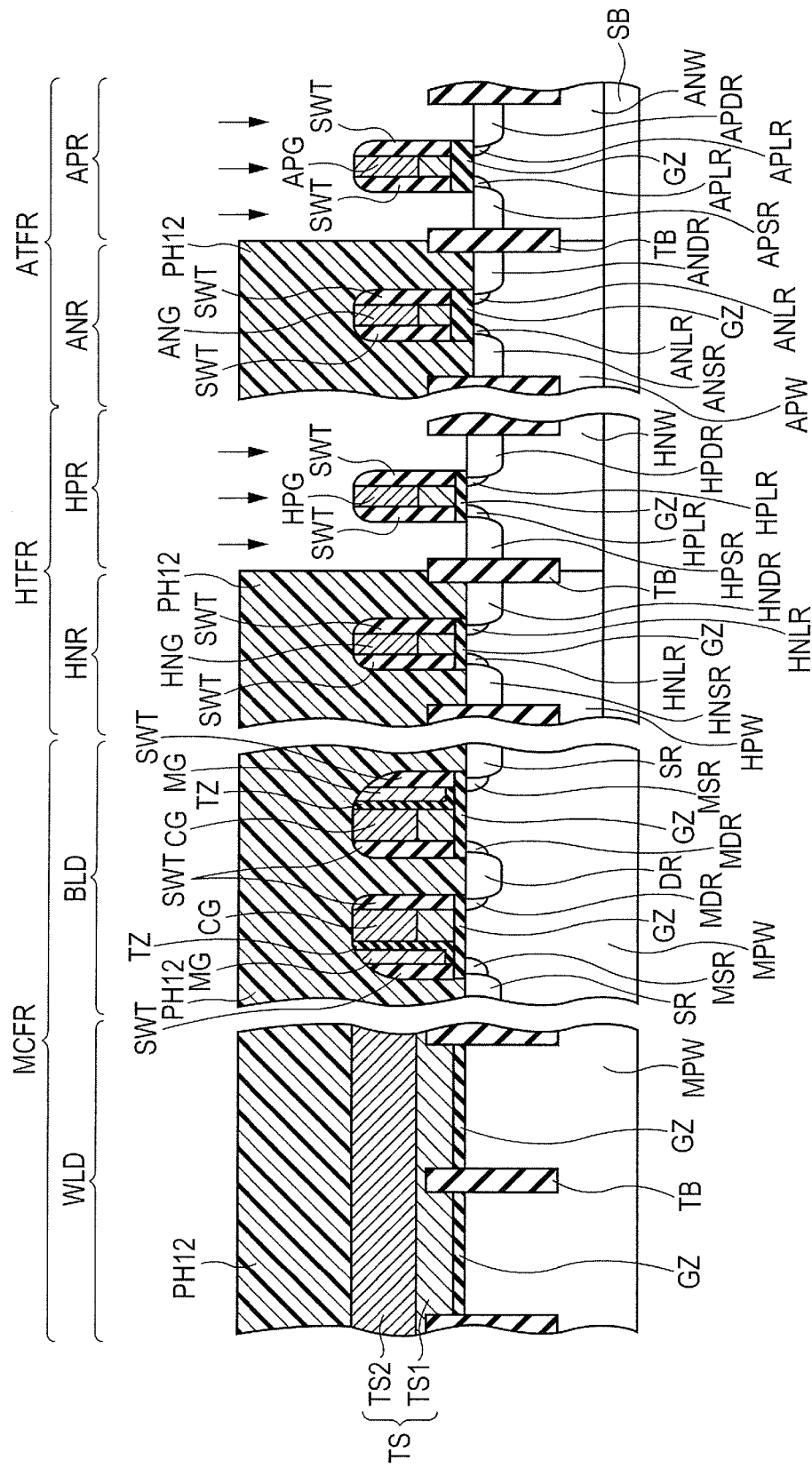
FIG. 28 is a cross-sectional view showing a step performed after the step shown in FIG. 27 in Embodiment 1.

Next, as shown in FIG. 28, a photoresist pattern PH12 is formed which exposes the region HPR of the region HTFR and the region APR of the region ATFR and covers the region MCFR, the region HNR of the region HTFR, and the region ANR of the region AFTR. Then, using the photoresist pattern PH12 and the like as a mask, a p-type impurity is implanted to form a source region HPSR and a drain region HPDR in the region HPR of the region HTFR and form a source region APSR and a drain region APDR in the region APR of the region ATFR. Thereafter, the photoresist pattern PH12 is removed.

Figure 29:
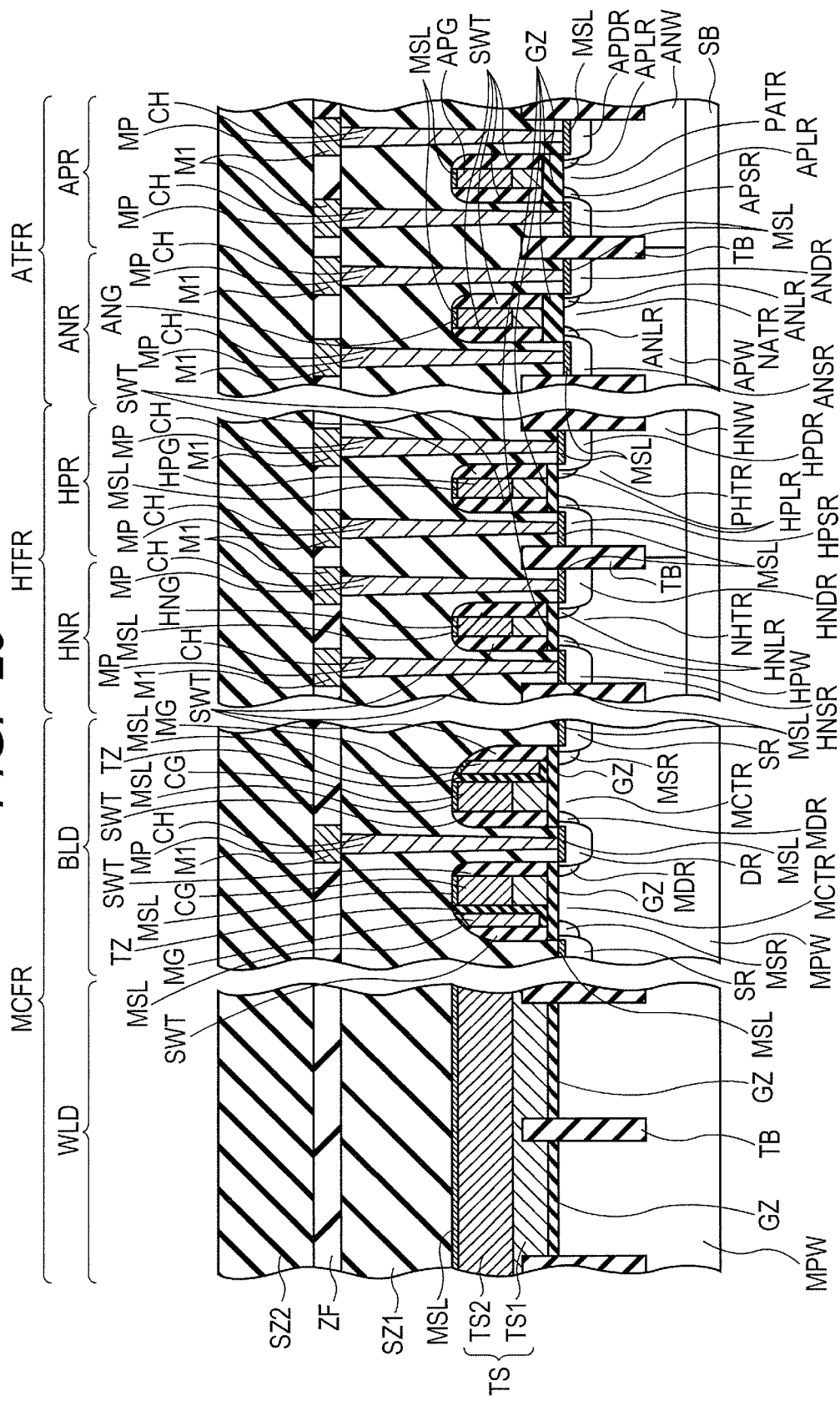
FIG. 29 is a cross-sectional view showing a step performed after the step shown in FIG. 28 in Embodiment 1.

Next, by a salicide (Self-Aligned Silicide) method, as shown in FIG. 29, over the respective surfaces of the control gate electrodes CG, the memory gate electrodes MG, the gate electrodes HNG, HPG, ANG, and APG, the source regions SR, the drain region DR, and the like, metal silicide films MSL made of, e.g., a cobalt silicide or the like are formed. In this manner, in the region MCFR, the memory cell transistors MCTR are formed. In the region HTFR, an n-channel core transistor NHTR and a p-channel core transistor PHTR are formed. In the region ATFR, an n-channel input/output transistor NATR and a p-channel input/output transistor PATR are formed.

Next, a first interlayer insulating film SZ1 such as, e.g., a BPTEOS (Borophosphorus doped Tetra Ethyl Ortho Silicate glass) film is formed so as to cover the memory cell transistors MCTR and the like. Next, predetermined photoengraving treatment and processing are performed to form, in the first interlayer insulating film SZ1, contact holes CH exposing the predetermined metal silicide film MSL. Then, in the contact holes CH, metal plugs MP are formed.

Next, an insulating film ZF is formed so as to cover the first interlayer insulating film SZ1 and, by, e.g., a damascene method, the insulating film ZF is formed with first interconnect wires M1. Next, a second interlayer insulating film SZ2 is formed so as to cover the first interconnect wires M1. Thereafter, wires in layers located thereabove (not shown) are formed. In this manner, the main portion of the semiconductor device is formed.

Next, a description will be given of an operation of each of the memory cell transistors MCTR in the semiconductor device described above. FIG. 30 shows an example of the values of respective voltages applied to the source region SR, the memory gate electrode MG, the control gate electrode CG, and the drain region DR when each of write, erase, and read operations is performed.

Figure 31:
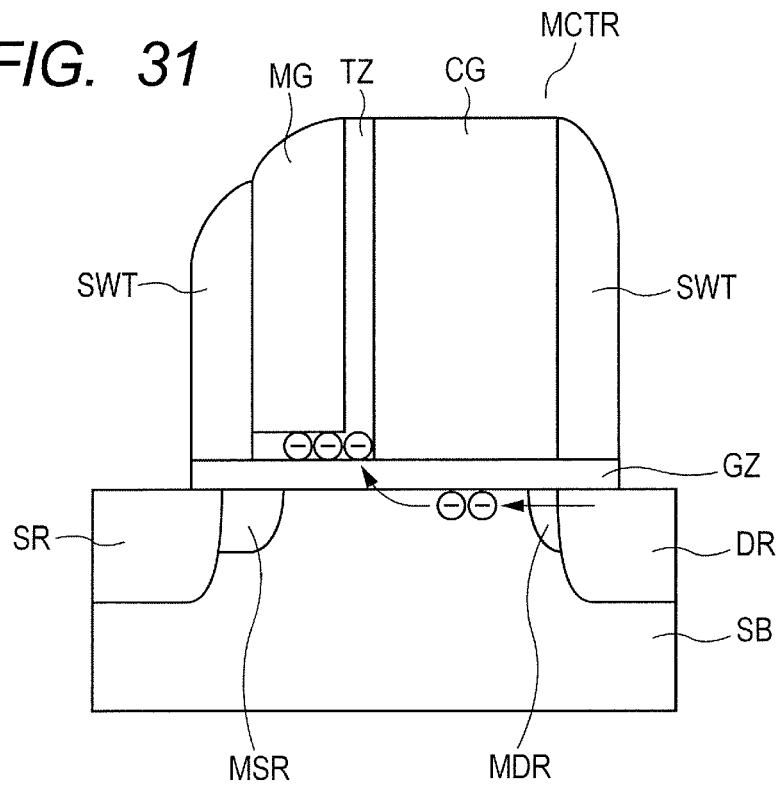
FIG. 31 is a cross-sectional view for illustrating a write operation of the memory cell transistor in Embodiment 1.

First, in the write operation, 5 V, 10 V, 1.0 V, and 0.4 V are applied to the source region SR, the memory gate electrode MG, the control gate electrode CG, and the drain region DR, respectively. At this time, as shown in FIG. 31, hot electrons generated through the acceleration of electrons flowing from the drain region DR to the source region SR are injected into the ONO film TZ holding charges which is located immediately below the memory gate electrode MG. The injection of the hot electrons into the ONO film TZ increases the threshold voltage of the memory gate electrode MG.

Figure 32:
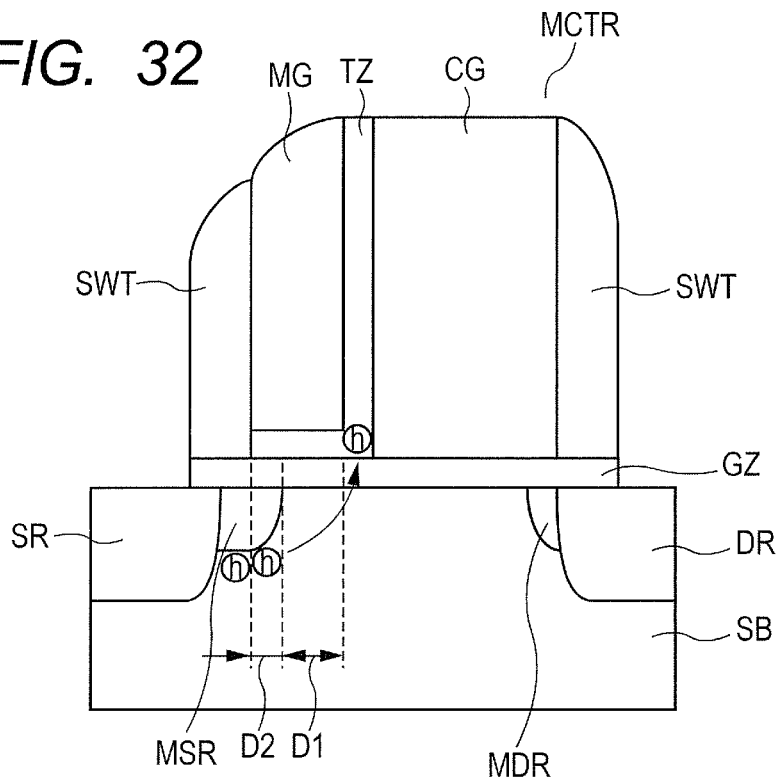
FIG. 32 is a cross-sectional view for illustrating an erase operation of the memory cell transistor in Embodiment 1.

On the other hand, in the erase operation, 6 V, −6 V, and 0 V are applied to the source region SR, the memory gate electrode MG, and the control gate electrode CG, respectively, to open the drain region DR. At this time, as shown in FIG. 32, holes generated in the vicinity of an end portion of the memory source region MSR located immediately below the memory gate electrode MG are injected into the ONO film TZ holding charges. The threshold voltage of the memory gate electrode MG increased by the injection of the hot electrons is reduced by the injection of the holes into the ONO film TZ.

In the read operation, a middle voltage between the threshold voltage of the memory gate electrode in the write state and the threshold voltage of the memory gate electrode in the erase state is applied to the memory gate electrode MG. For example, 1.5 V, 0 V, 1.5 V, and 1.5 V are applied to the memory gate electrode MG, the source region SR, the control gate electrode CG, and the drain region DR, respectively. At this time, the write state or the erase state is determined depending on whether or not a current flows.

In the memory cell transistor MCTR described above, as shown in FIG. 19, the memory source region MSR is formed by implanting an n-type impurity (arsenic) using the memory gate electrode MG and the sidewall high-temperature oxide films SWH formed over the side walls of the memory gate electrode MG as a mask. This can ensure a longer length in the gate length direction for the portion of the memory gate MG which does not oppose the memory source region MSR, i.e., ensure a longer memory gate electrode D1, which will be described using a comparative example.

In the semiconductor device according to the comparative example, through the same steps for the semiconductor device described above, the control gate electrodes of the memory cell transistors, the memory gate electrodes thereof, the gate electrodes of the core transistors, and the gate electrodes of the input/output transistors are formed.

Figure 33:
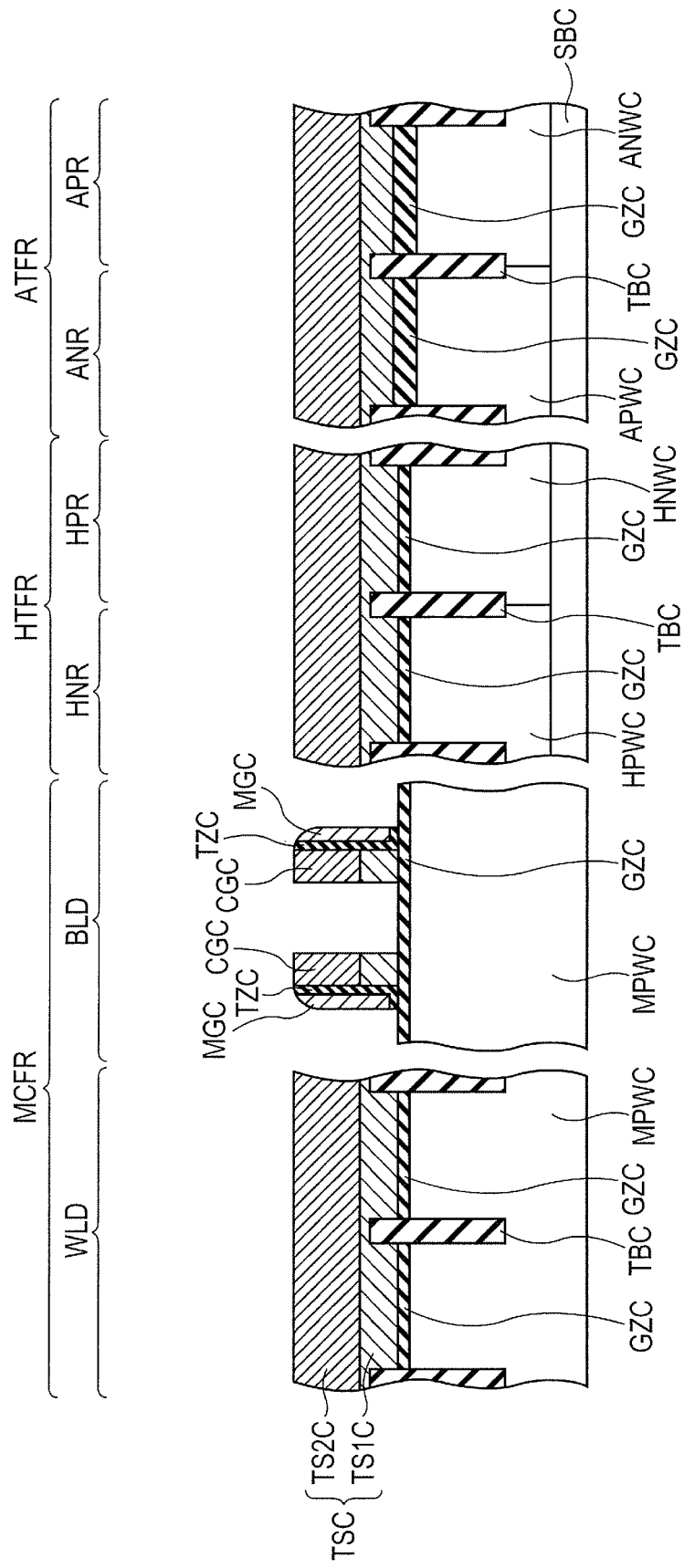
FIG. 33 is a cross-sectional view showing a step of a method of manufacturing a semiconductor device according to a comparative example.

As shown in FIG. 33, by the isolation insulating film TBC, the regions MCFR, HTFR, and ATFR where the memory cell transistors, the core transistors, and the input/output transistors are to be formed respectively are each defined. Then, in the region APR of the region ATFR, an N-well ANWC is formed and, in the region HPR of the region HTFR, an N-well HNWC is formed. Then, over the surface of the semiconductor substrate SB in each of the regions MCFR, HTFR, and ATFR, a polysilicon film TS1C is formed with a gate oxide film GZC being interposed therebetween. Thereafter, a P-well APWC is formed in the region ANR of the region ATFR, a P-well HPWC is formed in the region HNR of the region HTFR, and a P-well MPWC is formed in the region MCFR.

Then, after a polysilicon film TS2C is formed so as to cover the polysilicon film TS1C, control gate electrodes CGC are formed. After a doped polysilicon film is formed so as to cover the control gate electrodes CGC with ONO films TZC being interposed therebetween, over one of the both side walls of each of the control gate electrodes CGC, a memory gate electrode MGC comprised of a sidewall doped polysilicon film is formed.

Figure 34:
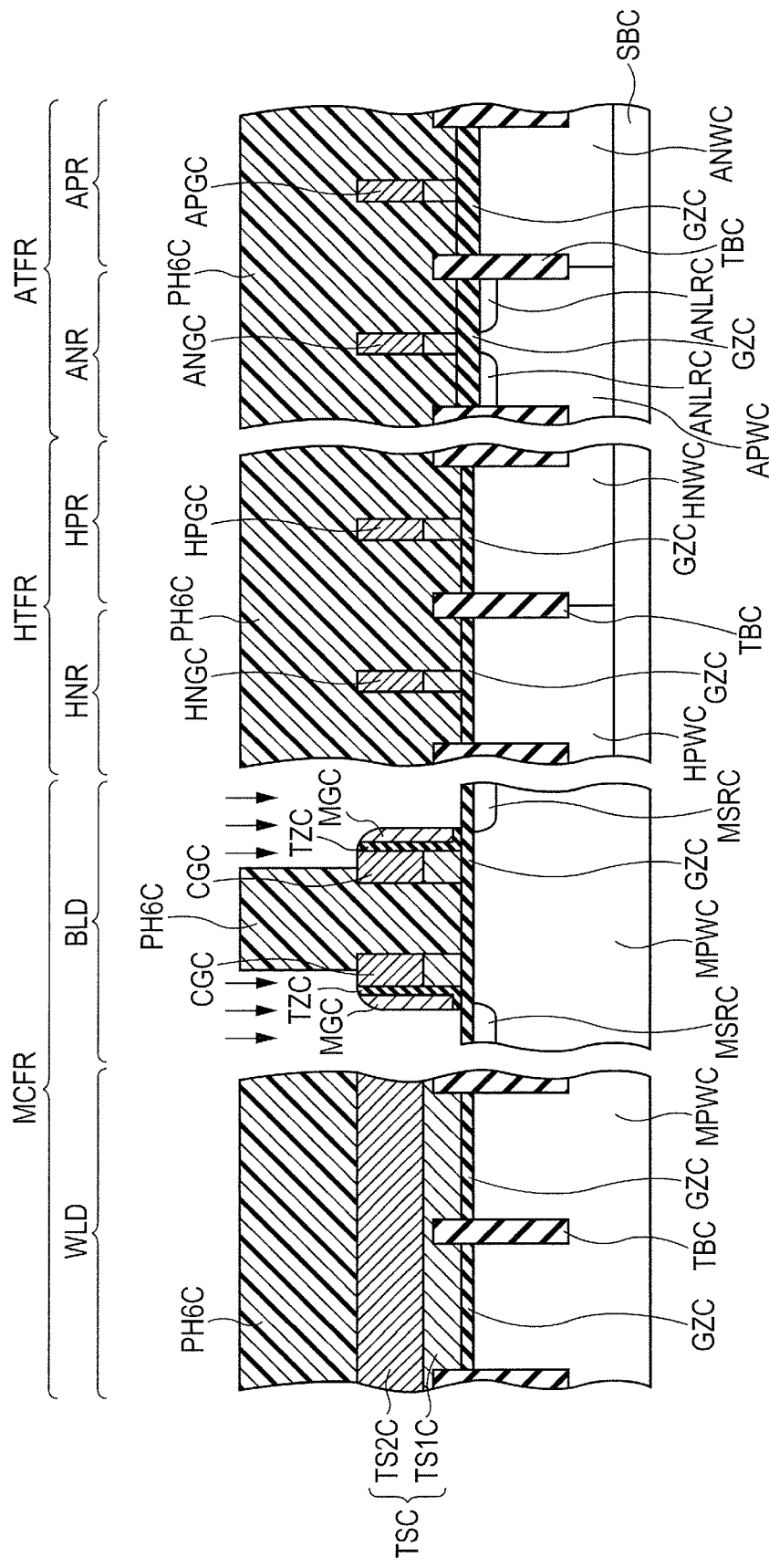
FIG. 34 is a cross-sectional view showing a step performed after the step shown in FIG. 33.

Next, as shown in FIG. 34, a gate electrode HNGC is formed in the region HNR of the region HTFR, a gate electrode HPGC is formed in the region HPR, a gate electrode ANGC is formed in the region ANR of the region ATFR, and a gate electrode APGC is formed in the region APR. Then, in the region ANR, a pair of LDD regions ANLRC are formed.

Next, a photoresist pattern PH6C is formed over the control gate electrodes CGC so as to expose the portions of the P-well MPWC located on the side on which the memory gate electrodes MGC are formed and cover the portions of the P-well MPWC located on the side on which the memory gate electrodes are not formed. Then, using the photoresist pattern PH6C, the memory gate electrodes MGC, and the like as a mask, an n-type impurity such as arsenic is implanted to form memory source regions MSRC. Thereafter, the photoresist pattern PH6C is removed.

Figure 35:
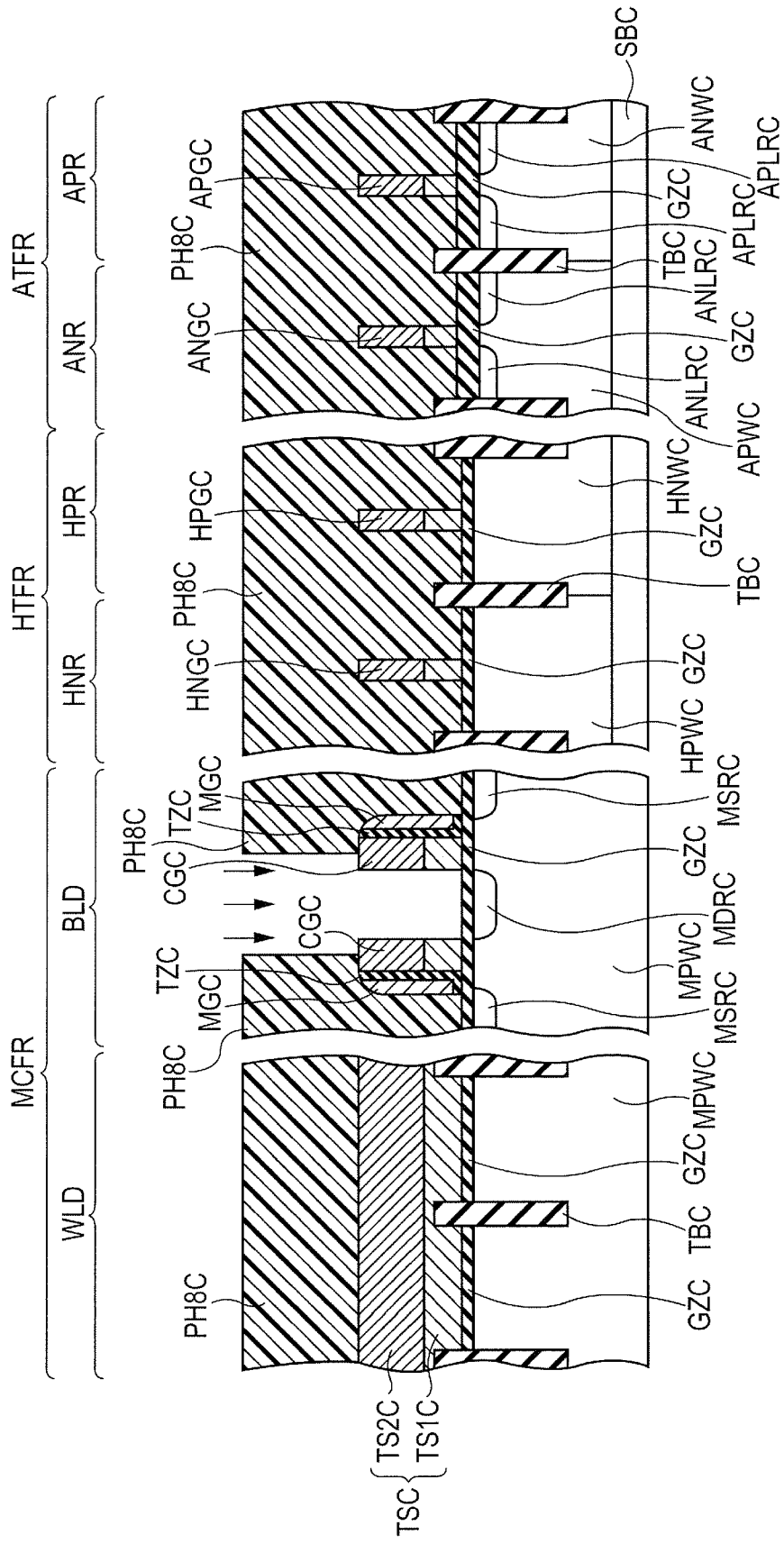
FIG. 35 is a cross-sectional view showing a step performed after the step shown in FIG. 34.

Next, as shown in FIG. 35, a pair of LDD regions APLRC are formed in the region APR. A photoresist pattern PH8C is formed over the control gate electrodes CGC so as to expose the portions of the P-well MPWC located on the side on which the memory gate electrodes MGC are not formed and cover the portions of the P-well MPWC located on the side on which the memory gate electrodes are formed. Then, using the photoresist pattern PH8C and the like as a mask, an n-type impurity such as arsenic is implanted to form a memory drain region MDRC. Thereafter, the photoresist pattern PH8C is removed.

Figure 36:
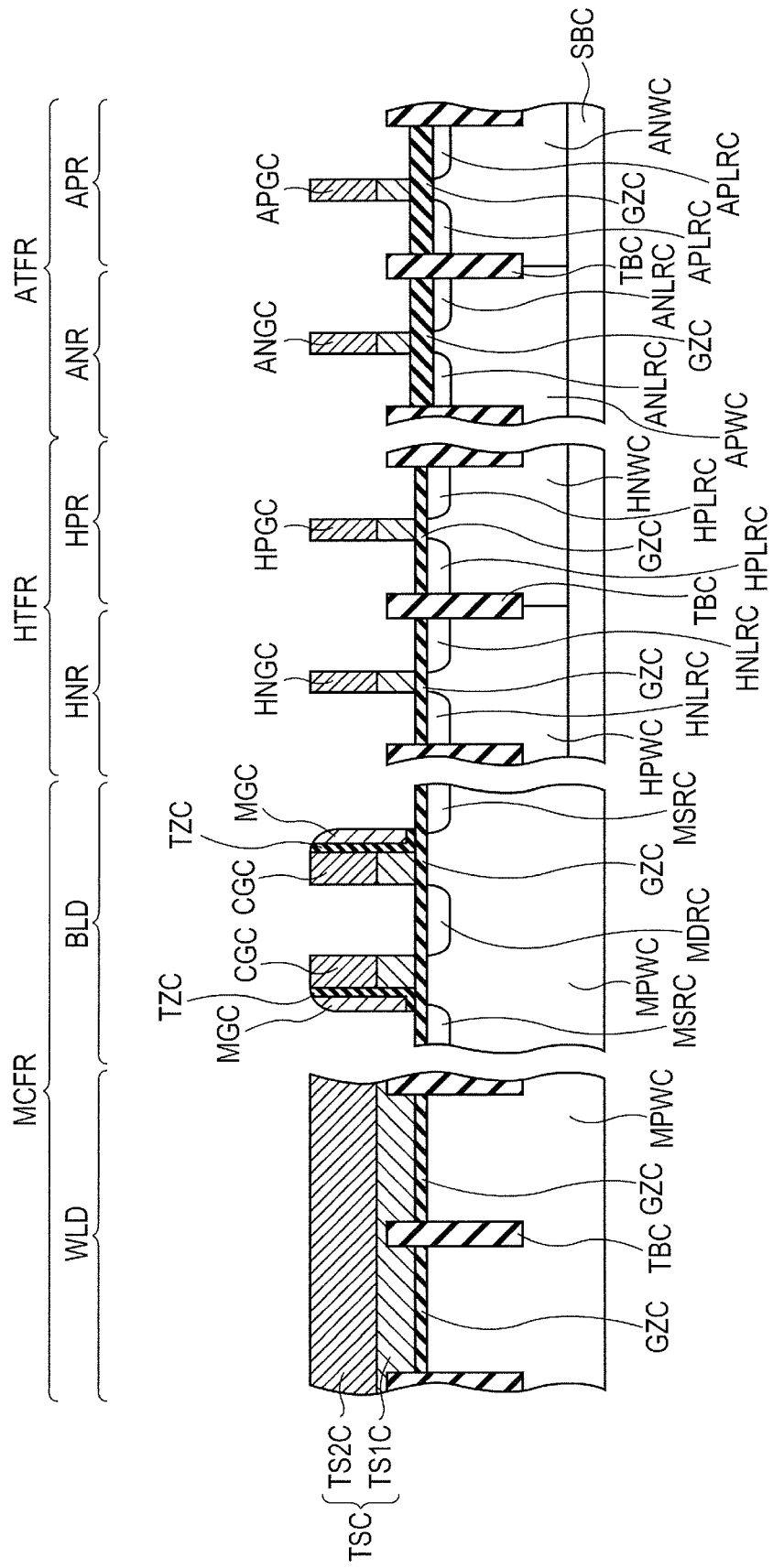
FIG. 36 is a cross-sectional view showing a step performed after the step shown in FIG. 35.
Figure 37:
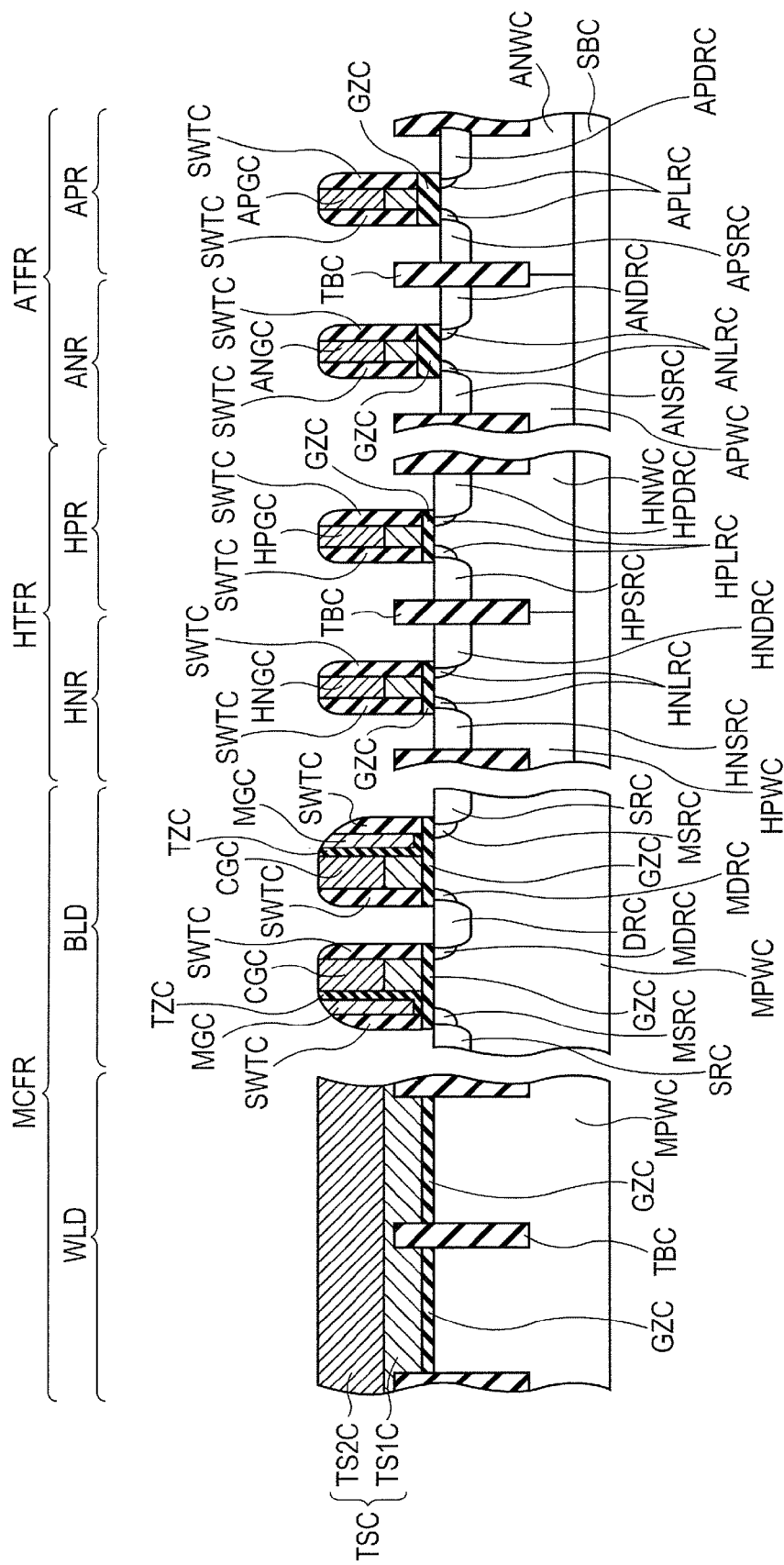
FIG. 37 is a cross-sectional view showing a step performed after the step shown in FIG. 36.

Next, as shown in FIG. 36, a pair of LDD regions HNLRC are formed in the region HNR, and a pair of LDD regions HPLRC are formed in the region HPR. Then, as shown in FIG. 37, over the respective side walls of the control gate electrodes CGC, the memory gate electrodes MGC, and the gate electrodes HNGC, HPGC, ANGC, and APGC, sidewall TEOS films SWTC are formed.

Next, in the region MCFR, source regions SRC and a drain region DRC are formed. In the region HNR, a source region HNSRC and a drain region HNDRC are formed. In the region ANR, a source region ANSRC and a drain region ANDRC are formed. Then, in the region HPR of the region HTFR, a source region HPSRC and a drain region HPDRC are formed. In the region APR of the region ATFR, a source region APSRC and a drain region APDRC are formed. Thereafter, through the same step as the step shown in FIG. 29 described above, the main portion of the semiconductor device according to the comparative example is formed.

Figure 38:
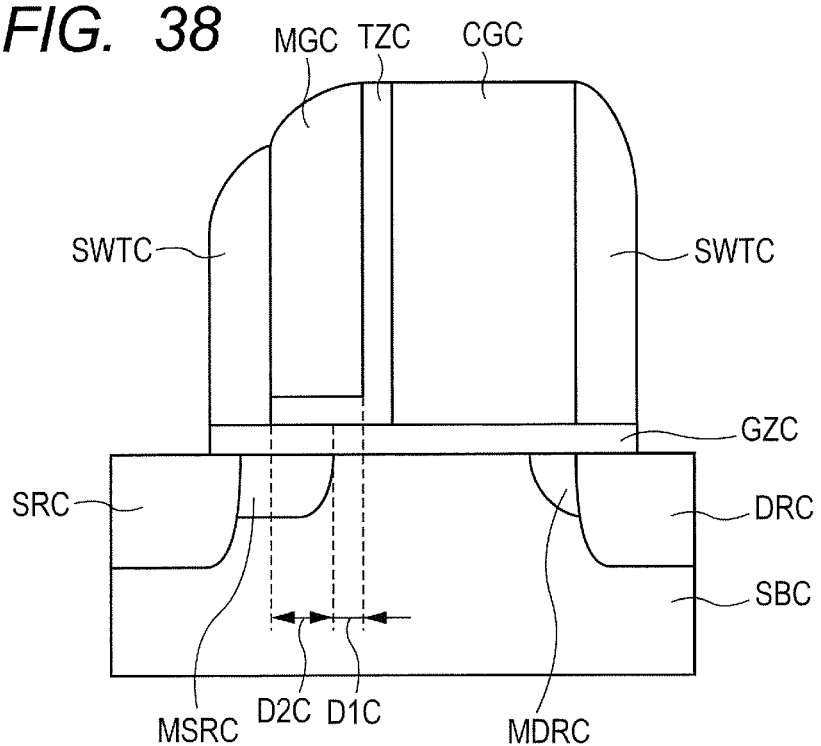
FIG. 38 is a cross-sectional view showing a structure of a memory cell transistor in the semiconductor device according to the comparative example.

In the memory cell transistor of the semiconductor device according to the comparative example, as shown in FIG. 34, the memory source regions MSRC are formed by implanting an n-type impurity using the photoresist pattern PH6C and the memory gate electrode MGC as a mask. Accordingly, compared to the memory source region MSR (see FIG. 19) formed using also the sidewall high-temperature oxide films SWH as a mask, a length D2C in the gate length direction in which the memory source region MSRC and the memory gate electrode MGC oppose each other is increased. As a result, as shown in FIG. 38, the length in the gate length direction of the portion in which the memory source region MSRC and the memory gate electrode MGC do not oppose each other, i.e., a memory gate length D1C is accordingly reduced due to the increased length D2C.

Figure 39:
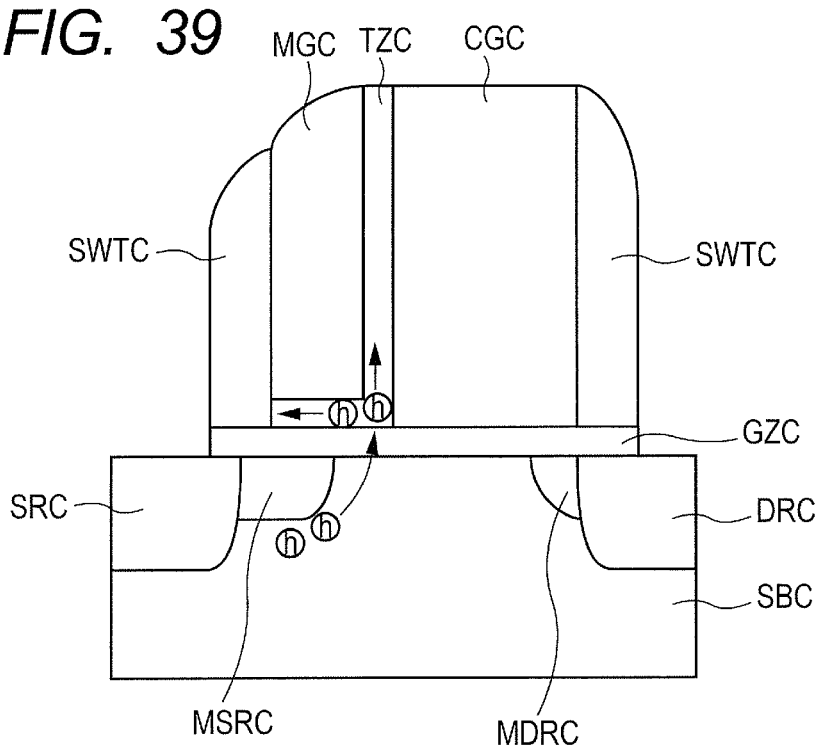
FIG. 39 is a cross-sectional view for illustrating the problem of the memory cell transistor in the semiconductor device according to the comparative example.

As shown in FIG. 39, when the memory gate length D1C is reduced, the holes implanted into the ONO film TZC holding charges in the erase operation are more likely to be diffused. Consequently, the threshold voltage of the memory gate electrode MGC that has been reduced by the implantation of the holes may accordingly increase due to the holes that have been diffused and dissipated, resulting in the deterioration of a so-called retention characteristic.

In a memory cell transistor having a split-gate MONOS structure, it is important to ensure a sufficient memory gate length in terms of maintaining the reliability of the memory cell transistor. However, if the thickness of the memory gate electrode MGC is increased, it is required to ensure an overlay margin between the source region SRC formed using the memory gate electrode and the sidewall TEOS film as a mask or the like and the contact (metal plug). As a result, the area occupied by the memory cell transistor increases. In the entire region where the memory cell transistor is formed, about a 1% increase in initial dimensions (size) is expected.

In contrast to the memory cell transistor in the comparative example, in the memory cell transistor MCTR in the semiconductor device described above, the memory source region MSR is formed using the memory gate electrode MG and the sidewall high-temperature oxide film SWH formed over the side wall of the memory gate electrode MG as a mask. Accordingly, due to the presence of the sidewall high-temperature oxide film SWH, the channel-side end of the memory source region MSR is located further away from the memory gate electrode MG (or the control gate electrode CG) in the gate length direction. This ensures the memory gate length D1 of the memory gate electrode MG which is longer than the memory gate length D1C in the comparative example. As a result, it is possible to inhibit the holes injected into the ONO film TZC holding charges in the erase operation from being diffused and retain the retention characteristic.

In addition, the sidewall high-temperature oxide films SWH disappear due to a cleaning solution or the like after the photoresist patterns or the like are removed by the time the sidewall TEOS films SWT are formed. Therefore, the operation of the semiconductor device (memory cell transistor) can be stabilized without affecting the final layout of the semiconductor device nor increasing the area occupied by the region MCFR where the memory cell transistor is formed.

Besides, by the time the sidewall high-temperature oxide films SHW disappear, the side walls of the memory gate electrode MG are covered with the sidewall high-temperature oxide films SWH. This can inhibit the portion of the ONO film TZ located between the memory gate electrode MG and the gate oxide film GZ from being etched by the cleaning solution in the subsequent step. As a result, it is possible to ensure the reliability of the operation of the memory cell transistor MCTR.

Moreover, since the side walls of the memory gate electrode MG are covered with the sidewall high-temperature oxide films SWH, when a foreign material is present on a lateral side of the memory gate electrode MG, a defect such as a short-circuit failure resulting from such a foreign material can be inhibited.

In the semiconductor device described above, the memory gate length D1 of the memory gate electrode MG is sufficiently ensured. As a result, structurally, the memory gate length D1 is longer than the length D2 in the gate length direction of the portion in which the memory gate electrode MG and the memory source region MSR oppose each other (D1>D2).

Embodiment 2

Here, a description will be given of another example of the method of manufacturing the semiconductor device including the flash memory.

Figure 40:
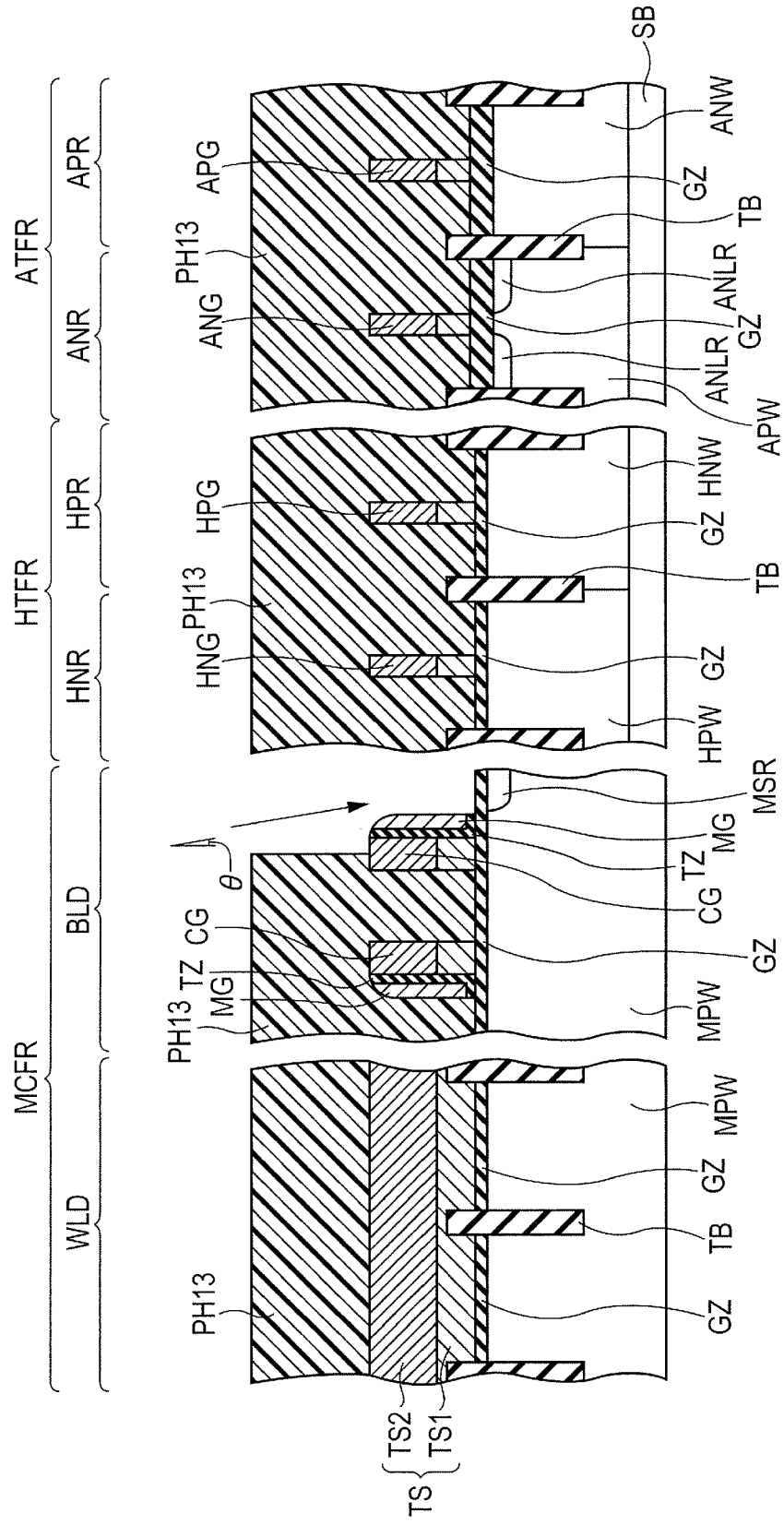
FIG. 40 is a cross-sectional view showing a step of a method of manufacturing a semiconductor device according to Example 2.

As shown in FIG. 40, first, in the region MCFR where the memory cell transistors are to be formed, through the same steps as the steps shown in FIGS. 4 to 10 described above, the control gate electrodes CG and the memory gate electrodes MG are formed. In the region HTFR where the core transistors are to be formed and in the region ATFR where the input/output transistors are to be formed, through the same steps as the steps shown in FIGS. 16 and 17, the gate electrodes HNG, HPG, ANG, and APG are formed.

Also, in the region ANR, through the same step as the step shown in FIG. 18, the pair of LDD regions ANLR are formed. Note that, in FIG. 40 and the like, the same members as the members described in the method of manufacturing the semiconductor device described above are designated by the same reference numerals.

Next, a photoresist pattern PH13 for forming the memory source region MSR of one of the memory cell transistors is formed. In the region MCFR, the photoresist pattern PH13 is formed so as to cover the region of the P-well MPW located on the side on which one of the control gate electrodes CG is disposed and expose the region (first area) thereof located on the side on which the memory gate electrode MG corresponding thereto is disposed as well as the side walls of the memory gate electrode MG. In the regions HTFR and ATFR, the photoresist pattern PH13 is formed so as to cover the regions HNR, HPR, ANR, and APR.

Next, using the photoresist pattern PH13 as a mask, an n-type impurity is implanted into the first area of the P-well MPW obliquely (at an angle $\theta$ of about 2 to 3°) to the surface of the semiconductor substrate SB, while gradually moving away from the side wall of the memory gate electrode MG in a direction from the upper portion of the memory gate electrode MG toward the lower portion thereof to form the memory source region MSR. Thereafter, the photoresist pattern PH13 is removed.

Figure 41:
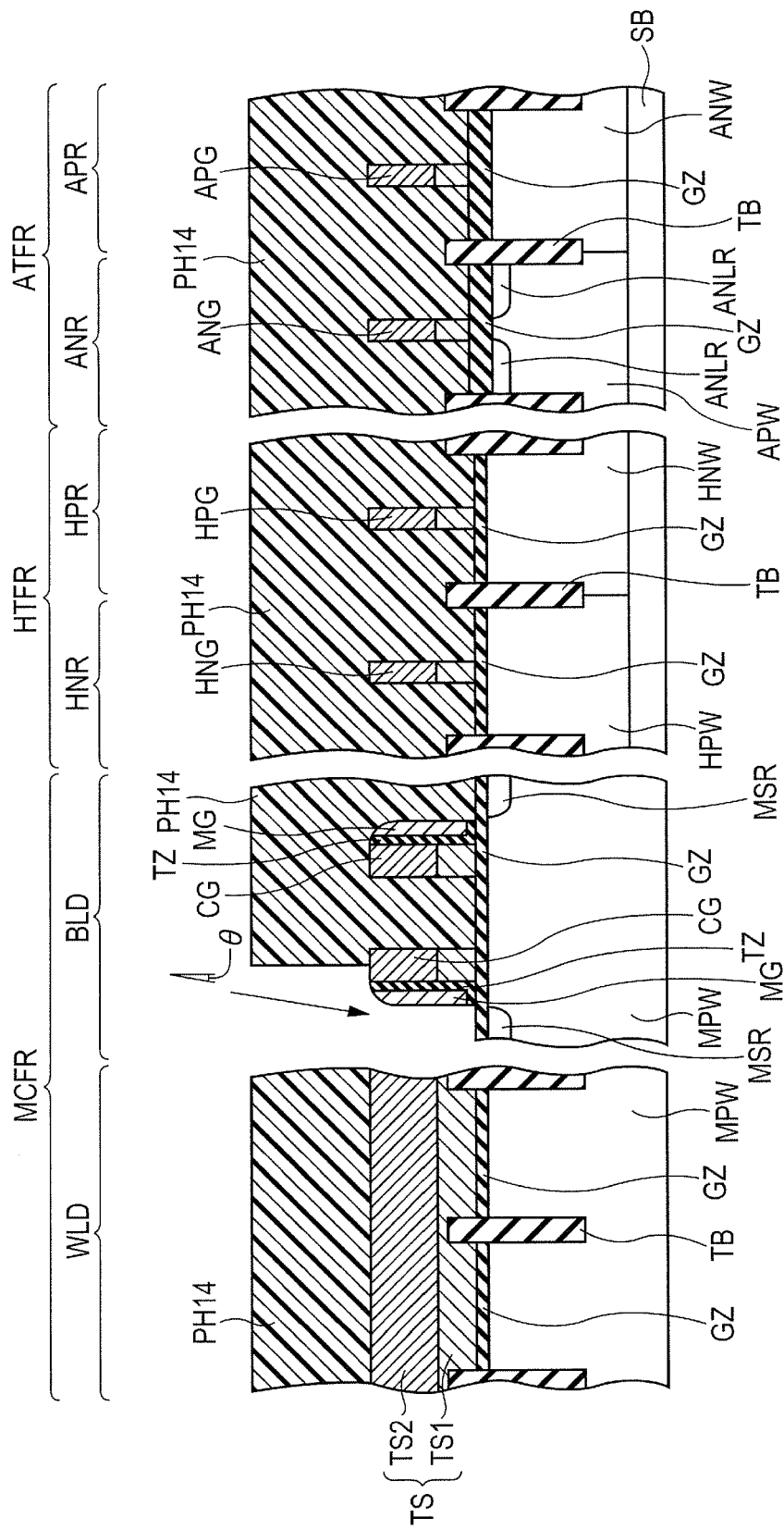
FIG. 41 is a cross-sectional view showing a step performed after the step shown in FIG. 40.

Next, as shown in FIG. 41, a photoresist pattern PH14 for forming the memory source region MSR of the other memory cell transistor is formed. In the region MCFR, the photoresist pattern PH14 is formed so as to cover the region of the P-well MPW located on the side on which the other control gate electrode CG is disposed and expose the region (first area) thereof located on the side on which the memory gate electrode MG corresponding thereto is disposed as well as the side wall of the memory gate electrode MG. In the regions HTFR and ATFR, the photoresist pattern PH14 is formed so as to cover the regions HNR, HPR, ANR, and APR.

Next, using the photoresist pattern PH14 as a mask, an n-type impurity is implanted into the first area of the P-well MPW obliquely (at an angle $\theta$ of about 2 to 3°) to the surface of the semiconductor substrate SB, while gradually moving away from the side wall of the memory gate electrode MG in a direction from the upper portion of the memory gate electrode MG toward the lower portion thereof to form the memory source region MSR. Thereafter, the photoresist pattern PH14 is removed. Then, in the region APR, through the same step as the step shown in FIG. 20, the pair of LDD regions APLR (see FIG. 42) are formed.

Figure 42:
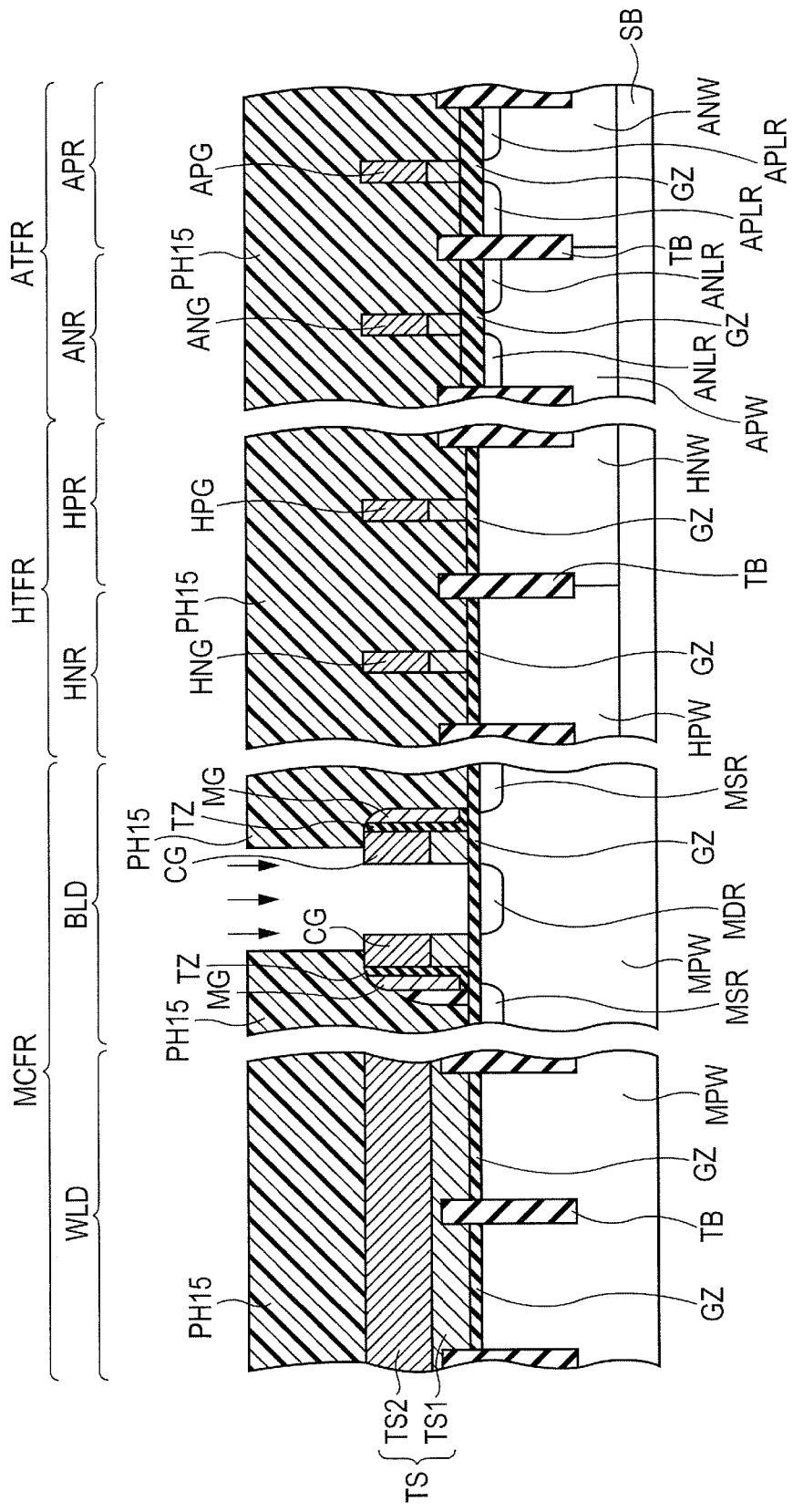
FIG. 42 is a cross-sectional view showing a step performed after the step shown in FIG. 41.

Next, through the same step as the step shown in FIG. 21, as shown in FIG. 42, a photoresist pattern PH15 for forming the memory drain region is formed. Next, using the photoresist pattern PH15 as a mask, an n-type impurity and a p-type impurity are each implanted to form the memory drain region MDR. Thereafter, the photoresist pattern PH15 is removed. After the photoresist pattern PH15 is removed, through the same steps as the steps shown in FIGS. 22 to 29, the main portion of the semiconductor device is formed.

In the memory cell transistor MCTR in the semiconductor device described above, the memory source region MSR is formed by, using the photoresist pattern PH13 or the photoresist pattern PH14 as a mask, implanting an n-type impurity into the exposed first area of the P-well MPW obliquely (at an angle $\theta$ of about 2 to 3°) to the surface of the semiconductor substrate SB, while gradually moving away from the side wall of the memory gate electrode MG in a direction from the upper portion of the memory gate electrode MG toward the lower portion thereof.

Accordingly, compared to the case of implanting an n-type impurity substantially perpendicularly to the surface of the semiconductor substrate SB, the channel-side end of the memory source region MSR can be located further away from the memory gate electrode MG (or the control gate electrode CG) in the gate length direction. This ensures the memory gate length D1 of the memory gate electrode MG which is longer than the memory gate length D1C of the comparative example described above. As a result, it is possible to inhibit the holes injected into the ONO film TZC holding charges in the erase operation from being diffused and retain the retention characteristic.

In addition, since the photoresist patterns PH13 and PH14 are removed, the final layout of the semiconductor device is not affected thereby. As a result, it is possible to stabilize the operation of the semiconductor device (memory cell transistor) without increasing the area occupied by the region MCFR where the memory cell transistor is formed.

Figure 43:
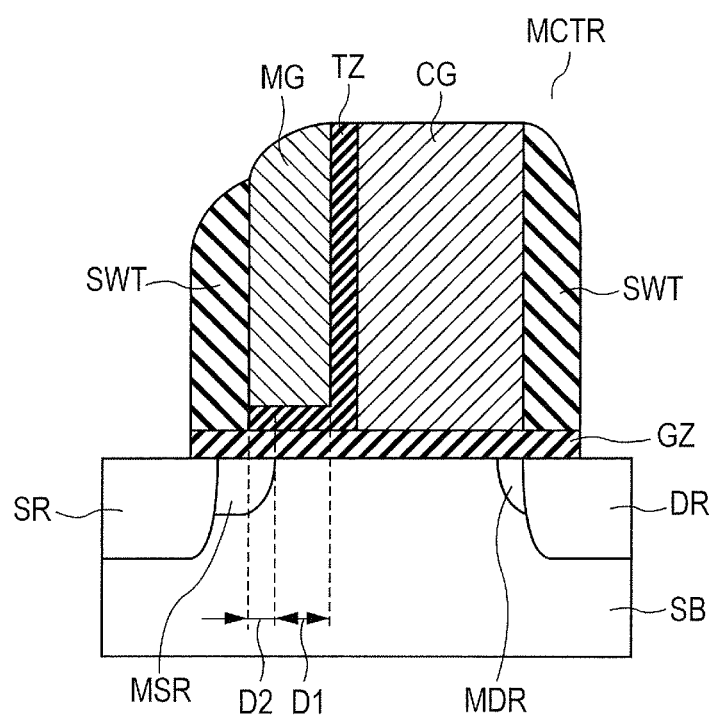
FIG. 43 is a cross-sectional view showing a structure of a memory cell transistor in the semiconductor device in Example 2.

When the memory source region MSR is formed, the position of the channel-side end of the memory source region MSR varies depending on the angle $\theta$ at which an n-type impurity is implanted. Therefore, by controlling the implantation angle $\theta$, the memory gate length D1 shown in FIG. 43 can be adjusted. In the semiconductor device described above, the memory gate length D1 of the memory gate electrode MG is sufficiently ensured. As a result, structurally, the memory gate length D1 is longer than the length D2 in the gate length direction of the portion in which the memory gate electrode MG and the memory source region MSR oppose each other (D1>D2) in the same manner as in the semiconductor device described in Embodiment 1.

Note that, in the manufacturing method described in Embodiment 1, to form the memory source region MSR, the photoresist pattern PH6 (see FIG. 19) is formed as the implantation mask. That is, the number of the photomasks required to form the memory source region MSR is one.

By contrast, in the manufacturing method described above, to form the memory source region MSR, the photoresist patterns PH13 and PH14 are formed as the implantation mask. That is, the number of the photomasks required to form the memory source region MSR is two, which is larger by one than in the case of Embodiment 1.

Also, numeric values in the conditions or the like given in each of the embodiments described above are only exemplary, and the present invention is not limited to these numeric values.

While the invention achieved by the present inventors has been specifically described heretofore based on the embodiments thereof, the present invention is not limited to the foregoing embodiments. It will be appreciated that various changes and modifications can be made in the invention within the scope not departing from the gist thereof.

What is claimed is:

1. A method of manufacturing a semiconductor device, comprising the steps of:
    defining, in a main surface of a semiconductor substrate, first through third element formation regions using isolation insulating films;
    forming a first gate electrode over a surface of the first element formation region;
    forming a second gate electrode between one of side walls of the first gate electrode and the surface of the first element formation region with an insulating film holding charges being disposed therebetween;
    forming an offset spacer over a side wall of the second gate electrode;
    after forming the offset spacer, forming a third gate electrode over a surface of the second element formation region and forming a fourth gate electrode over a surface of the third element formation region;
    implanting a predetermined impurity into a first area of the first element formation region which is located on a side on which the second gate electrode of the first and second gate electrodes is disposed to form an impurity region of a predetermined conductivity type; and
    removing the offset spacer.

2. A method of manufacturing a semiconductor device according to claim 1,
    wherein the step of removing the offset spacer includes the step of, after the impurity region is formed, removing the offset spacer by cleaning.

3. A method of manufacturing a semiconductor device according to claim 1,
    wherein, in the step of forming the offset spacer, a high-temperature oxide film is formed.

* * * * *